US011143682B2

(12) United States Patent
Embleton et al.

(10) Patent No.: US 11,143,682 B2
(45) Date of Patent: Oct. 12, 2021

(54) SYSTEM AND METHOD FOR COMMUNICATING EXTERNALLY FROM AN ELECTROMAGNETIC INTERFERENCE SUPPRESSED VOLUME

(71) Applicant: Dell Products L.P., Hopkinton, MA (US)

(72) Inventors: Steven Embleton, Round Rock, TX (US); Ben John Sy, Austin, TX (US); Eric Michael Tunks, Austin, TX (US)

(73) Assignee: DELL PRODUCTS L.P., Hopkinton, MA (US)

( * ) Notice: Subject to any disclaimer, the term of this patent is extended or adjusted under 35 U.S.C. 154(b) by 142 days.

(21) Appl. No.: 16/516,972

(22) Filed: Jul. 19, 2019

(65) Prior Publication Data

US 2021/0018546 A1 Jan. 21, 2021

(51) Int. Cl.
| | |
|---|---|
| H04B 15/02 | (2006.01) |
| G01R 29/08 | (2006.01) |
| H05K 9/00 | (2006.01) |
| G06F 1/16 | (2006.01) |
| G01R 29/00 | (2006.01) |
| H04W 4/80 | (2018.01) |

(52) U.S. Cl.
CPC ....... *G01R 29/0821* (2013.01); *G06F 1/1656* (2013.01); *H04B 15/02* (2013.01); *H05K 9/0009* (2013.01); *H05K 9/0018* (2013.01); *G01R 29/00* (2013.01); *H04W 4/80* (2018.02)

(58) Field of Classification Search
CPC .......................... G01R 29/0821; H05K 9/0018
See application file for complete search history.

(56) References Cited

U.S. PATENT DOCUMENTS

| | | | |
|---|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |
| 5,084,802 A | 1/1992 | Nguyenngoc |
| 5,250,752 A | 10/1993 | Cutright |

(Continued)

OTHER PUBLICATIONS

Gary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

(Continued)

*Primary Examiner* — Tuan H Nguyen
(74) *Attorney, Agent, or Firm* — Chamberlain, Hrdlicka, White, Williams & Aughtry

(57) ABSTRACT

A data processing device includes an internal volume that is electromagnetic interference (EMI) isolated. The data processing device further includes an electromagnetic radiation (EMR) suppressing vent that defines one wall of the internal volume. The data processing device further includes a wireless system. The wireless system includes a first portion that is disposed in the internal volume. The first portion receives network data units from EMI emitting devices disposed in the internal volume and a second portion of the wireless system. The second portion is disposed outside of the internal volume and obtains the network data units from the first portion using a wireless connection that utilizes a transmission path that traverses through the EMR suppressing vent.

20 Claims, 11 Drawing Sheets

(56) References Cited

U.S. PATENT DOCUMENTS

| | | |
|---|---|---|
| 5,294,748 A | 3/1994 | Schwenk et al. |
| 5,323,298 A | 6/1994 | Shatas et al. |
| 5,437,560 A | 8/1995 | Mizuguchi |
| 5,545,844 A | 8/1996 | Plummer, III et al. |
| 5,545,845 A | 8/1996 | Flores |
| 5,649,831 A | 7/1997 | Townsend |
| 5,762,513 A | 6/1998 | Stine |
| 5,812,370 A | 9/1998 | Moore et al. |
| 5,943,218 A | 8/1999 | Liu |
| 6,011,221 A | 1/2000 | Lecinski et al. |
| 6,038,130 A | 3/2000 | Boeck et al. |
| 6,045,385 A | 4/2000 | Kane |
| 6,068,009 A | 5/2000 | Paes et al. |
| 6,176,727 B1 | 1/2001 | Liu et al. |
| 6,208,514 B1 | 3/2001 | Stark et al. |
| 6,225,554 B1 | 5/2001 | Trehan et al. |
| 6,242,690 B1 | 6/2001 | Glover |
| 6,269,001 B1 | 7/2001 | Matteson et al. |
| 6,331,940 B1 | 12/2001 | Lin |
| 6,332,792 B1 | 12/2001 | Lin et al. |
| 6,370,036 B1 | 4/2002 | Boe |
| 6,377,451 B1 | 4/2002 | Furuya |
| 6,437,987 B1 | 8/2002 | Lin |
| 6,517,369 B1 | 2/2003 | Butterbaugh et al. |
| 6,613,977 B1 | 9/2003 | Fowler |
| 6,657,214 B1 | 12/2003 | Foegelle et al. |
| 6,695,630 B1 | 2/2004 | Ku |
| 6,947,290 B2 | 9/2005 | Hirata |
| 7,035,087 B2 | 4/2006 | Tan |
| 7,075,796 B1 | 7/2006 | Pritchett |
| 7,133,296 B2 | 11/2006 | Choi et al. |
| 7,287,996 B1 | 10/2007 | Shing |
| 7,371,097 B1 | 5/2008 | Pennypacker et al. |
| 7,371,977 B1 | 5/2008 | Preonas |
| 7,692,934 B2 | 4/2010 | Bartscher et al. |
| 7,695,313 B2 | 4/2010 | Karim et al. |
| 7,757,847 B2 | 7/2010 | Tang et al. |
| 8,059,414 B2 | 11/2011 | Wei |
| 8,098,492 B2 | 1/2012 | Rosenberg et al. |
| 8,243,469 B2 * | 8/2012 | Jaze ............... H05K 9/0018 361/818 |
| 8,310,834 B2 | 11/2012 | Fürholzer |
| 8,508,956 B2 | 8/2013 | Nicol |
| 8,530,756 B1 | 9/2013 | Winch |
| 8,636,526 B2 | 1/2014 | Funamura et al. |
| 8,642,900 B2 | 2/2014 | Nordling et al. |
| 8,662,295 B2 | 3/2014 | Kubota et al. |
| 8,687,374 B2 | 4/2014 | Watanabe et al. |
| 8,720,682 B2 | 5/2014 | Navon et al. |
| 8,760,859 B2 | 6/2014 | Fuchs et al. |
| 8,969,738 B2 | 3/2015 | Ross |
| 9,019,711 B2 | 4/2015 | Tamura |
| 9,095,045 B2 | 7/2015 | Rojo et al. |
| 9,370,132 B2 | 6/2016 | Coppola |
| 9,497,894 B1 | 11/2016 | Ramsey |
| 9,549,480 B1 | 1/2017 | Besterman |
| 9,585,270 B2 | 2/2017 | Yang et al. |
| 9,607,660 B2 | 3/2017 | Bennett, II et al. |
| 9,640,910 B1 | 5/2017 | Chien et al. |
| 9,642,290 B2 | 5/2017 | Anderson et al. |
| 9,820,404 B1 | 11/2017 | Wu et al. |
| 9,829,939 B1 | 11/2017 | Lien et al. |
| 9,930,816 B2 | 3/2018 | Winch et al. |
| 10,007,309 B1 | 6/2018 | Imwalle |
| 10,249,984 B1 | 4/2019 | Rask |
| 10,364,031 B2 | 7/2019 | Goupil |
| 10,420,258 B1 | 9/2019 | Rahilly et al. |
| 10,477,740 B2 | 11/2019 | Coppola |
| 10,477,741 B1 | 11/2019 | Bae et al. |
| 10,492,324 B2 | 11/2019 | Miura |
| 10,520,532 B2 | 12/2019 | Lee |
| 10,541,519 B1 | 1/2020 | Wavering |
| 10,542,642 B2 | 1/2020 | Babhadiashar et al. |
| 10,575,443 B2 | 2/2020 | Woodbury, II et al. |
| 10,638,634 B1 | 4/2020 | Elsasser |
| 10,707,636 B2 | 7/2020 | Yamamoto |
| 10,720,722 B2 | 7/2020 | Tsomg et al. |
| 10,734,763 B2 | 8/2020 | M R et al. |
| 2002/0000645 A1 | 1/2002 | Sato et al. |
| 2002/0001181 A1 | 1/2002 | Kondo |
| 2002/0027769 A1 | 3/2002 | Kasahara et al. |
| 2002/0064035 A1 | 5/2002 | Mair et al. |
| 2003/0011988 A1 | 1/2003 | Irmer |
| 2003/0057131 A1 | 3/2003 | Diaferia |
| 2003/0137811 A1 | 7/2003 | Ling et al. |
| 2003/0174474 A1 | 9/2003 | Mair et al. |
| 2005/0247471 A1 | 11/2005 | Archambeault |
| 2006/0025010 A1 | 2/2006 | Spitaels et al. |
| 2007/0105445 A1 | 5/2007 | Manto et al. |
| 2007/0145699 A1 | 6/2007 | Robbins |
| 2007/0147013 A1 | 6/2007 | Robbins |
| 2007/0151779 A1 | 7/2007 | Robbins |
| 2008/0076291 A1 | 3/2008 | Ewing et al. |
| 2009/0021925 A1 | 1/2009 | Heimann |
| 2009/0095523 A1 | 4/2009 | Stevenson |
| 2009/0146862 A1 | 6/2009 | Malone |
| 2010/0117579 A1 | 5/2010 | Culbert |
| 2010/0208433 A1 | 8/2010 | Heimann et al. |
| 2010/0270299 A1 | 10/2010 | Baltussen |
| 2010/0285636 A1 | 11/2010 | Chen |
| 2010/0319981 A1 | 12/2010 | Kapusta et al. |
| 2011/0011760 A1 | 1/2011 | Habersetzer |
| 2011/0198245 A1 | 8/2011 | Soufan |
| 2011/0232956 A1 | 9/2011 | Ramsey |
| 2012/0011700 A1 | 1/2012 | Kelaher et al. |
| 2012/0044653 A1 | 2/2012 | Morris et al. |
| 2012/0073873 A1 | 3/2012 | Nash |
| 2012/0116590 A1 | 5/2012 | Florez-larrahondo |
| 2012/0178364 A1 | 7/2012 | Dobyns |
| 2012/0285738 A1 | 11/2012 | Cochrane et al. |
| 2013/0160563 A1 | 6/2013 | Dingier et al. |
| 2013/0194772 A1 | 8/2013 | Rojo |
| 2013/0206470 A1 | 8/2013 | Davis |
| 2013/0258582 A1 | 10/2013 | Shelnutt |
| 2013/0277520 A1 | 10/2013 | Funk et al. |
| 2014/0138388 A1 | 5/2014 | Synnestvedt |
| 2014/0368821 A1 | 12/2014 | Gazaway et al. |
| 2015/0014912 A1 | 1/2015 | Ivey et al. |
| 2015/0245529 A1 | 8/2015 | Tam et al. |
| 2015/0257310 A1 | 9/2015 | Desouza |
| 2015/0271959 A1 | 9/2015 | Chen et al. |
| 2015/0368423 A1 | 12/2015 | Yamauchi et al. |
| 2015/0373869 A1 | 12/2015 | Macerini et al. |
| 2016/0081231 A1 | 3/2016 | Berke |
| 2016/0111814 A1 | 4/2016 | Hirano et al. |
| 2016/0159480 A1 | 6/2016 | Barth |
| 2016/0182130 A1 | 6/2016 | Ahmed et al. |
| 2016/0372948 A1 | 12/2016 | Kvols |
| 2016/0381818 A1 | 12/2016 | Mills et al. |
| 2018/0062287 A1 | 3/2018 | Shaw et al. |
| 2018/0257334 A1 | 9/2018 | Motoyanagi et al. |
| 2019/0008079 A1 * | 1/2019 | Kondo ............... H05K 9/0022 |
| 2019/0050030 A1 | 2/2019 | Baum |
| 2019/0056439 A1 | 2/2019 | Lee |
| 2019/0159371 A1 | 5/2019 | Grinsteinner |
| 2019/0230828 A1 | 7/2019 | Murch |
| 2019/0304922 A1 | 10/2019 | Maruthamuthu et al. |
| 2019/0320796 A1 | 10/2019 | Ding |
| 2019/0353356 A1 | 11/2019 | Fischer |
| 2019/0379183 A1 | 12/2019 | Winsor |
| 2020/0187394 A1 | 6/2020 | Murugesan |
| 2020/0187578 A1 | 6/2020 | Sadato |

OTHER PUBLICATIONS

"Full HD Endoscopes"; joimax® GmbH, May 1, 2019; https://web.archive.org/web/20190501003355/https://www.loimax.com/en/products/electronic-devices/hd_endoscopes/.

"JRE 0814 RF Shielded Test Enclosure"; JRE Test, LLC, Apr. 22, 2019; https://web.archive.org/web/20190422094016/https://jretest.com/product/jre-0814/.

(56) References Cited

OTHER PUBLICATIONS

"Tapster"; Tapster Robotics, Inc., Sep. 30, 2017; https://web.archive.org/web/20170930111059/https://www.tapster.io/.

* cited by examiner

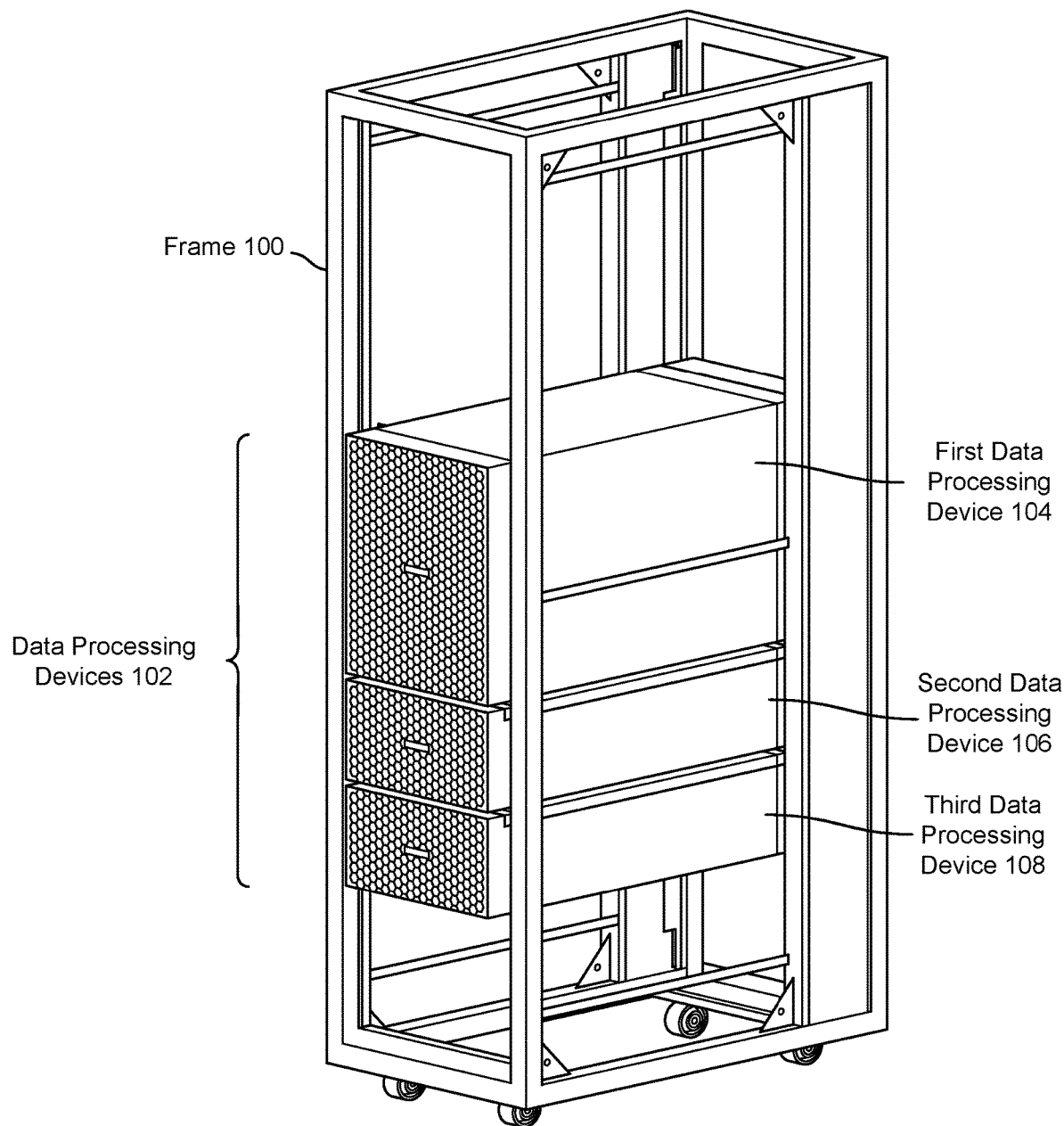
FIG. 1.1

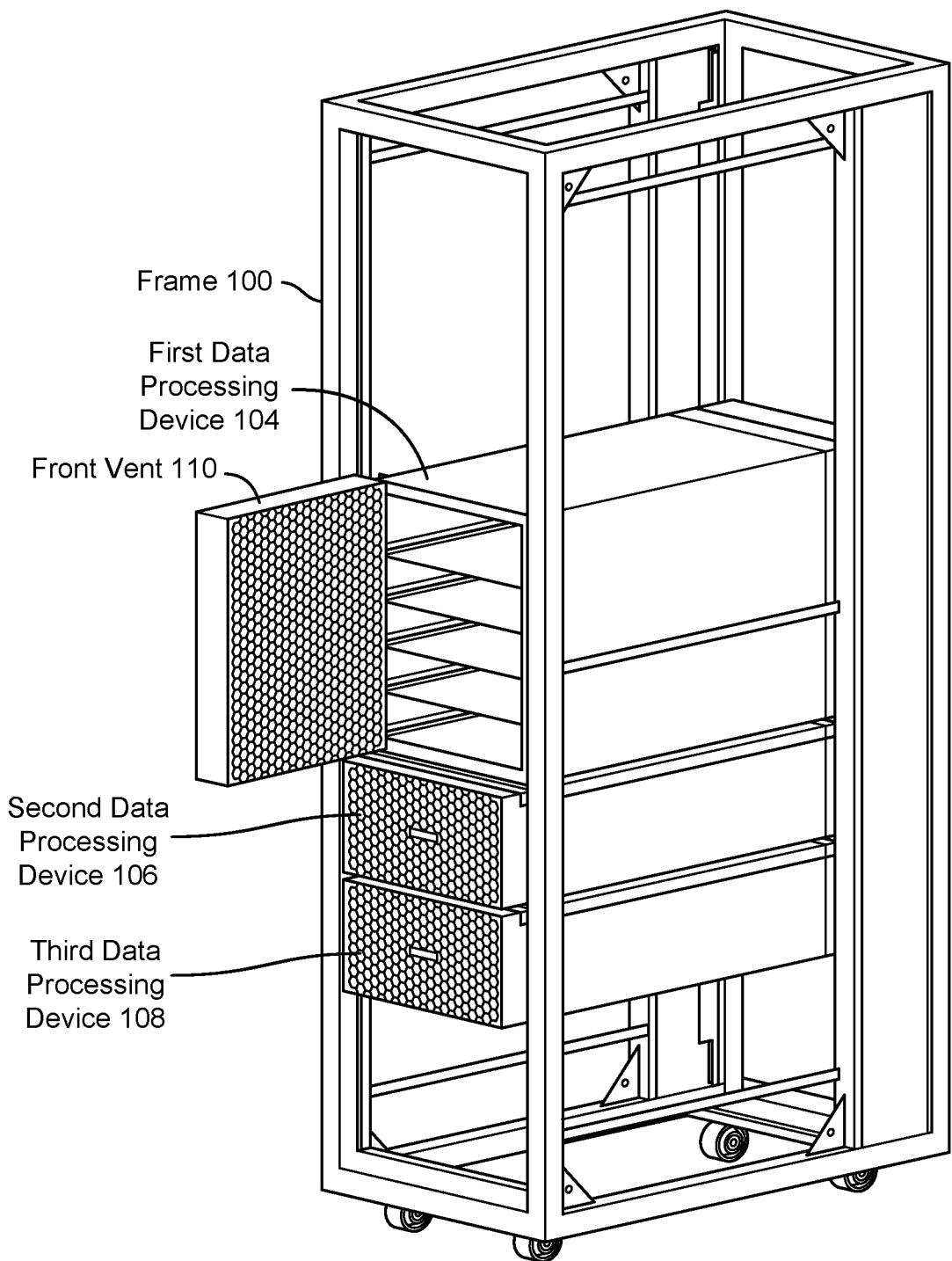
FIG. 1.2

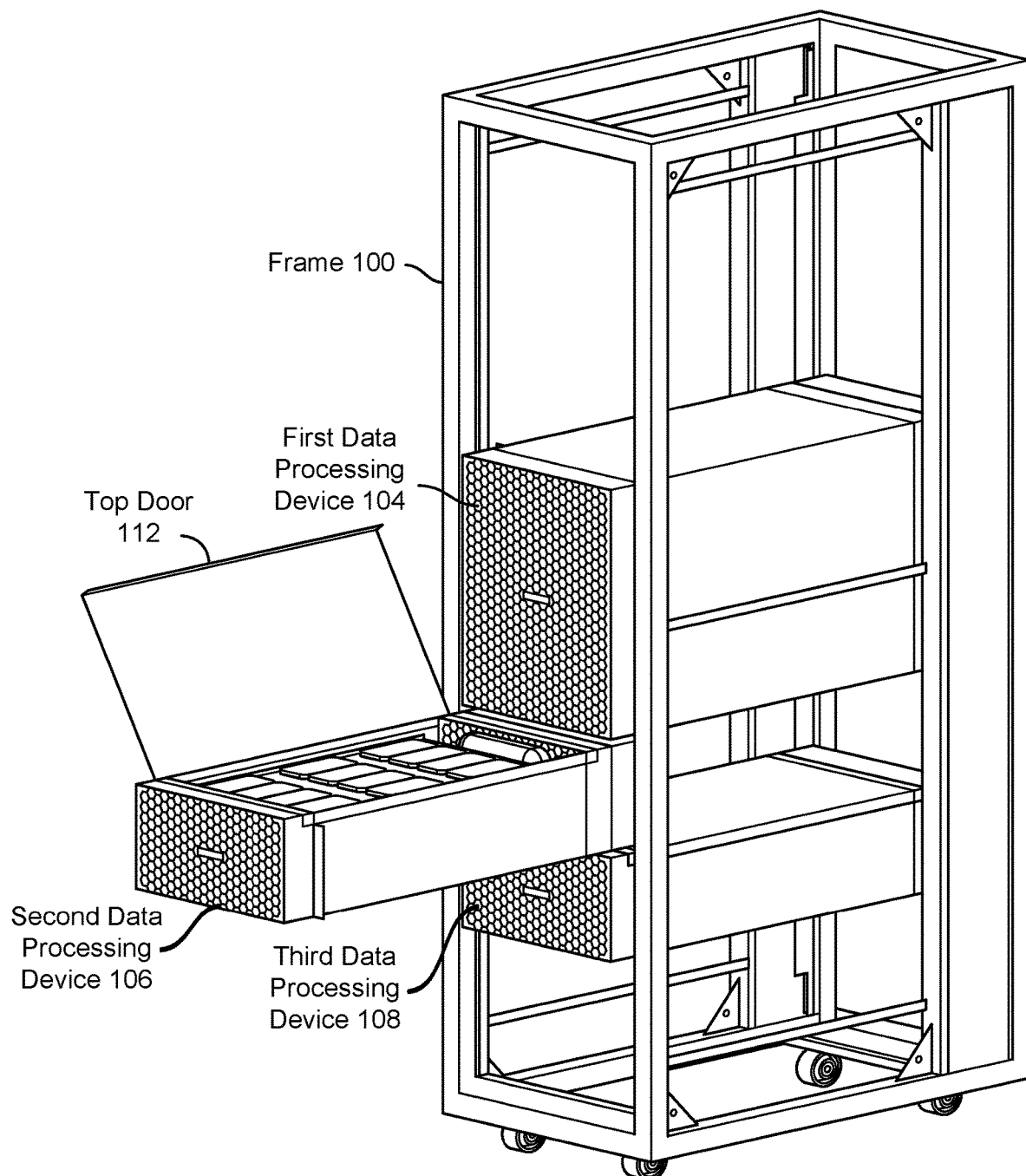
FIG. 1.3

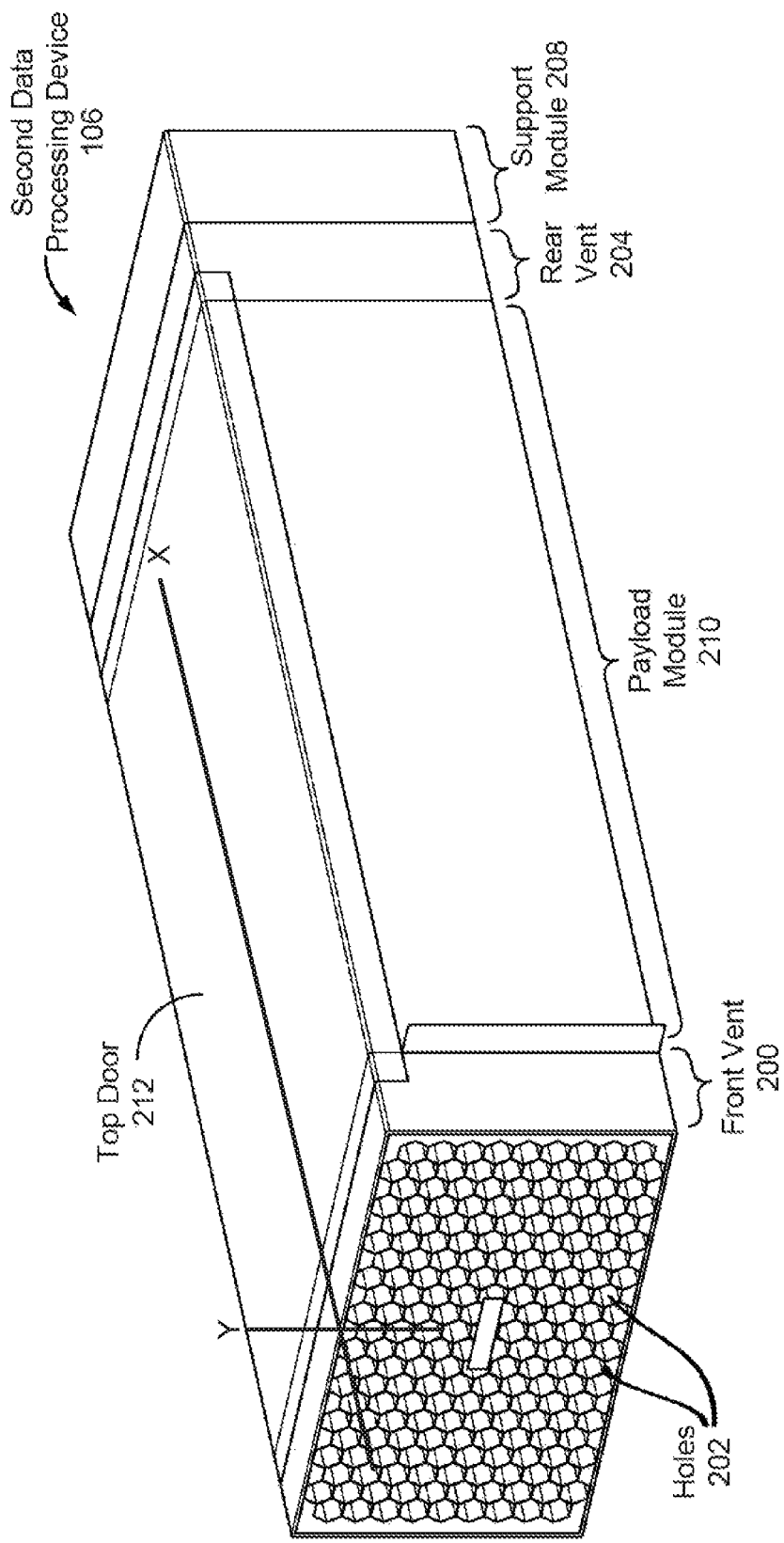
FIG. 2.1

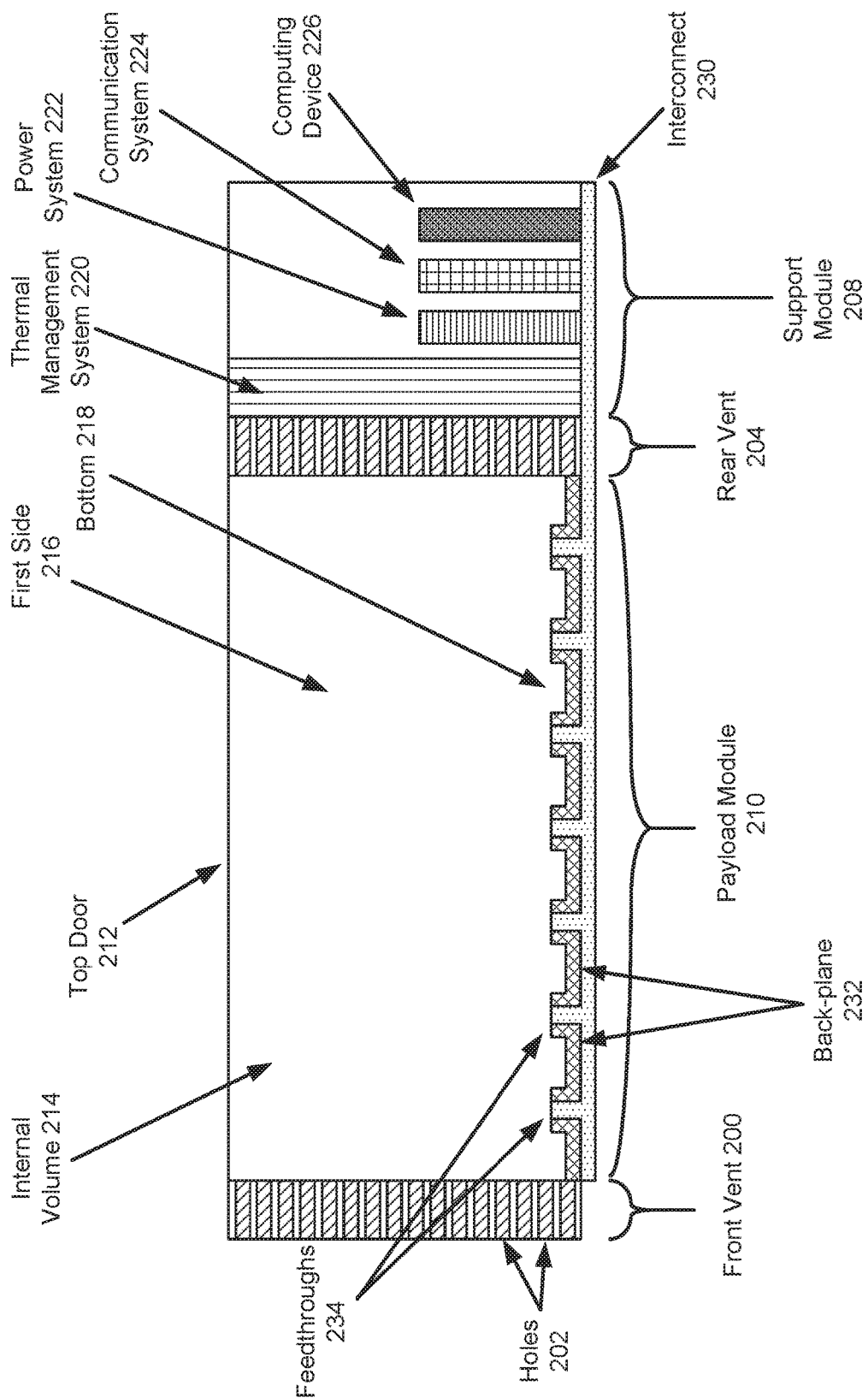
FIG. 2.2

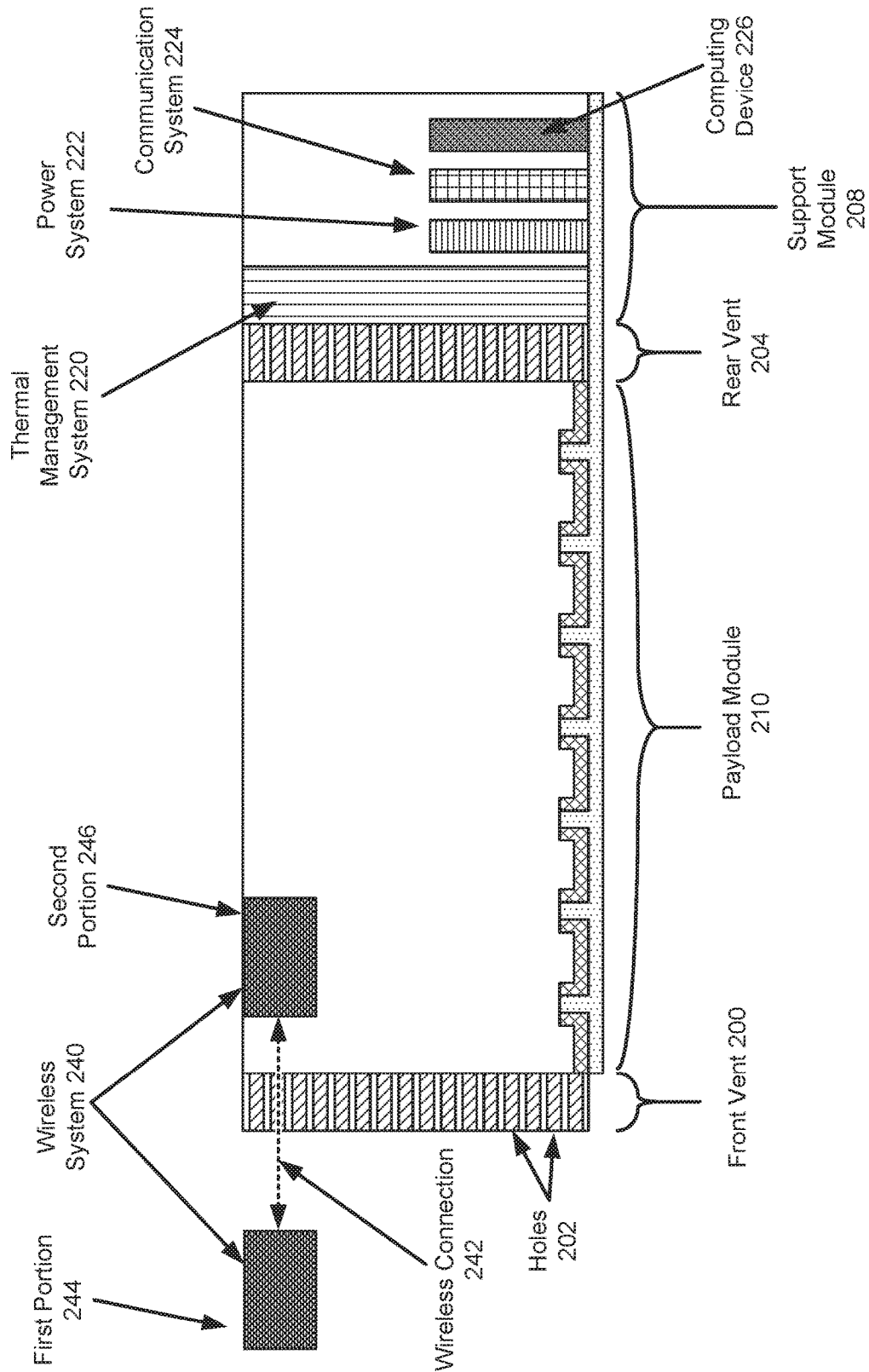
FIG. 2.3

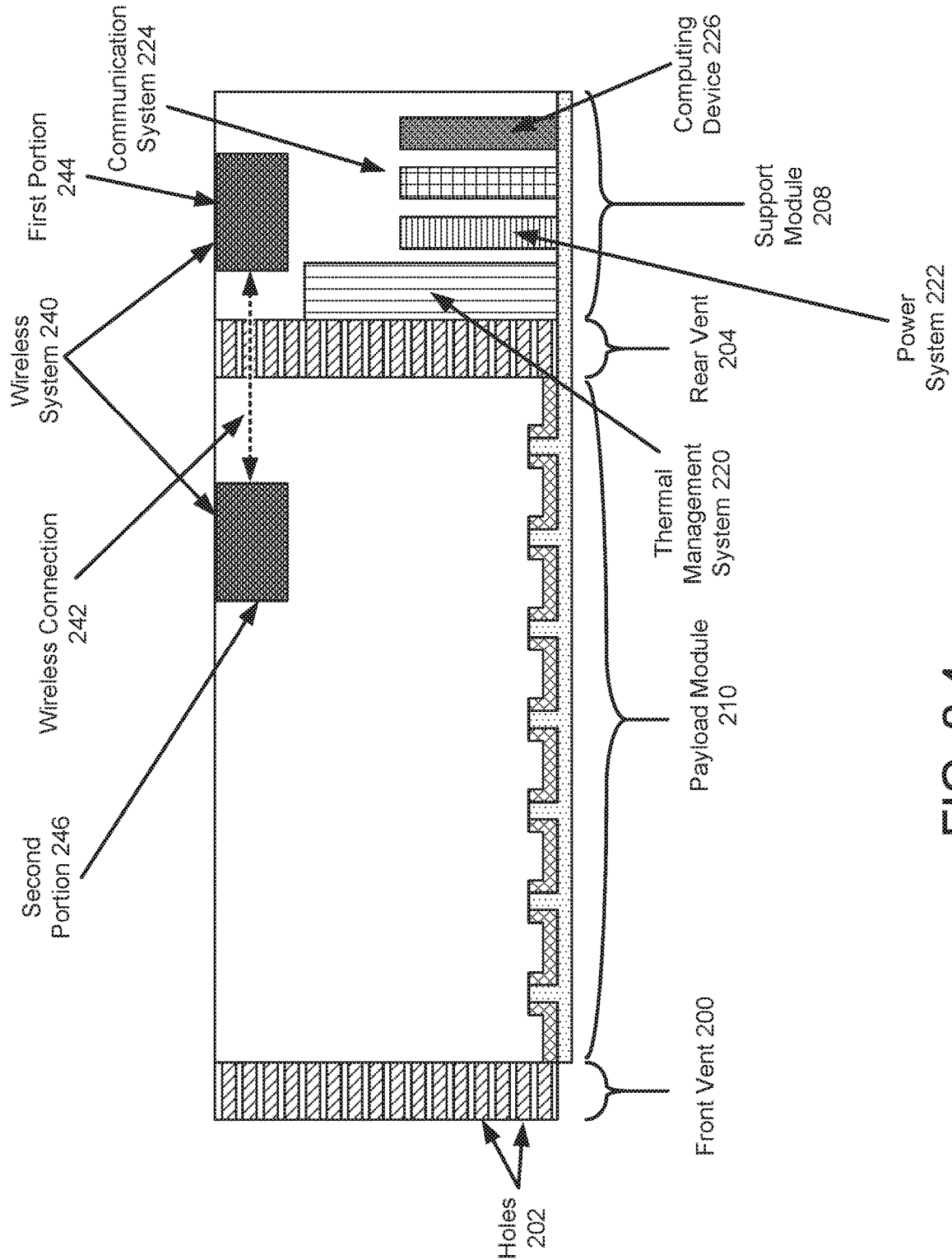
FIG. 2.4

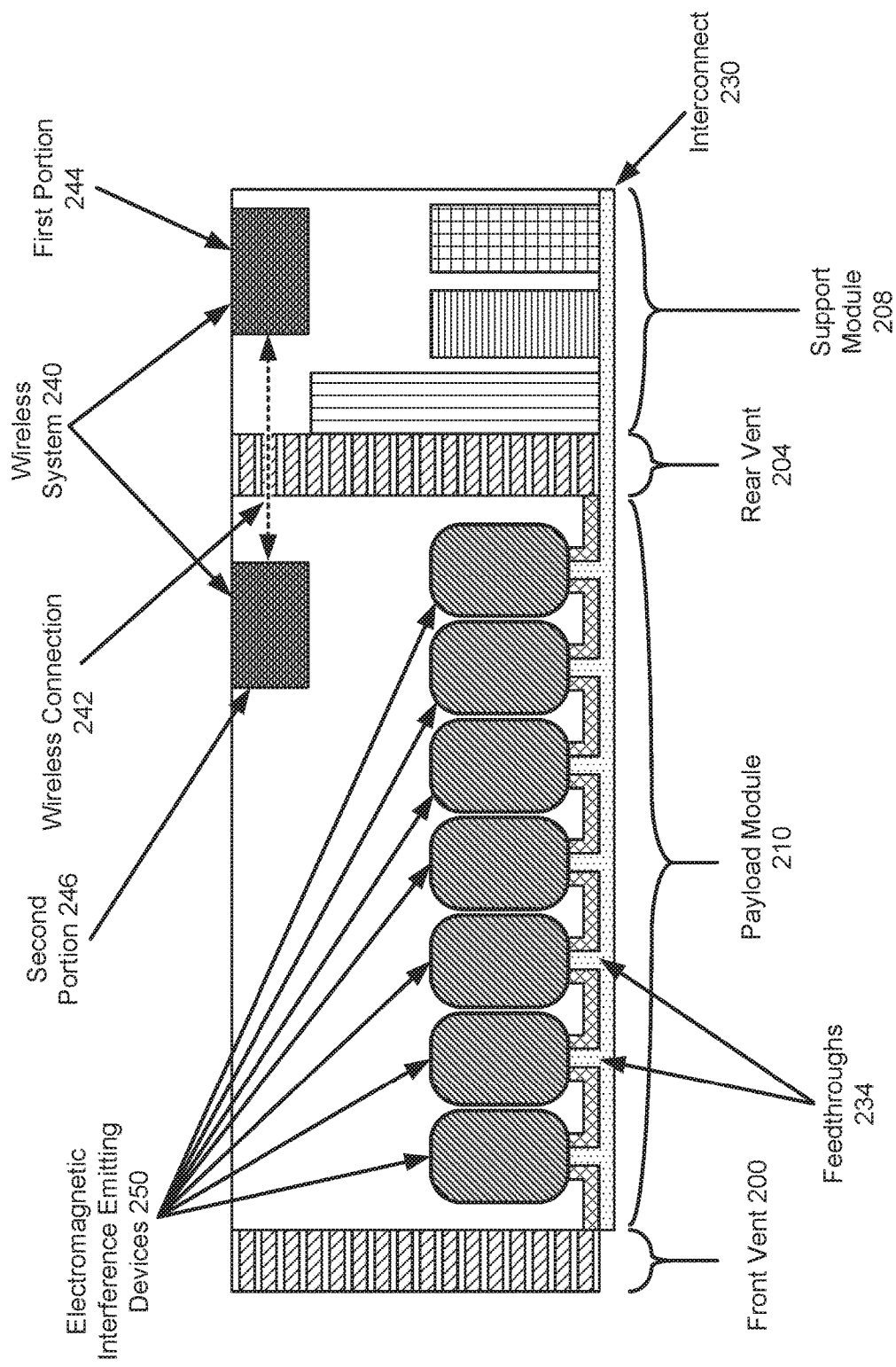
FIG. 2.5

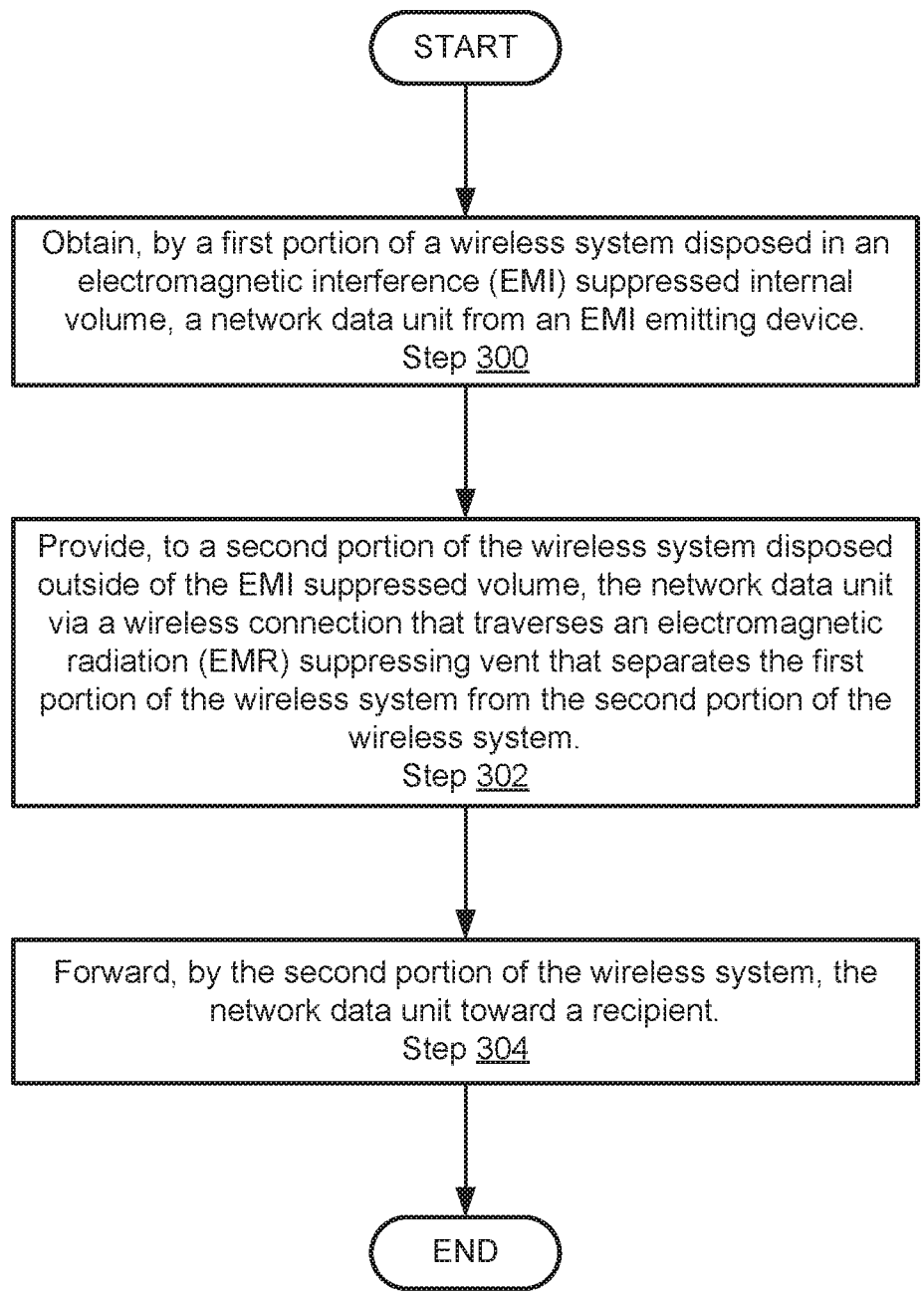
FIG. 3.1

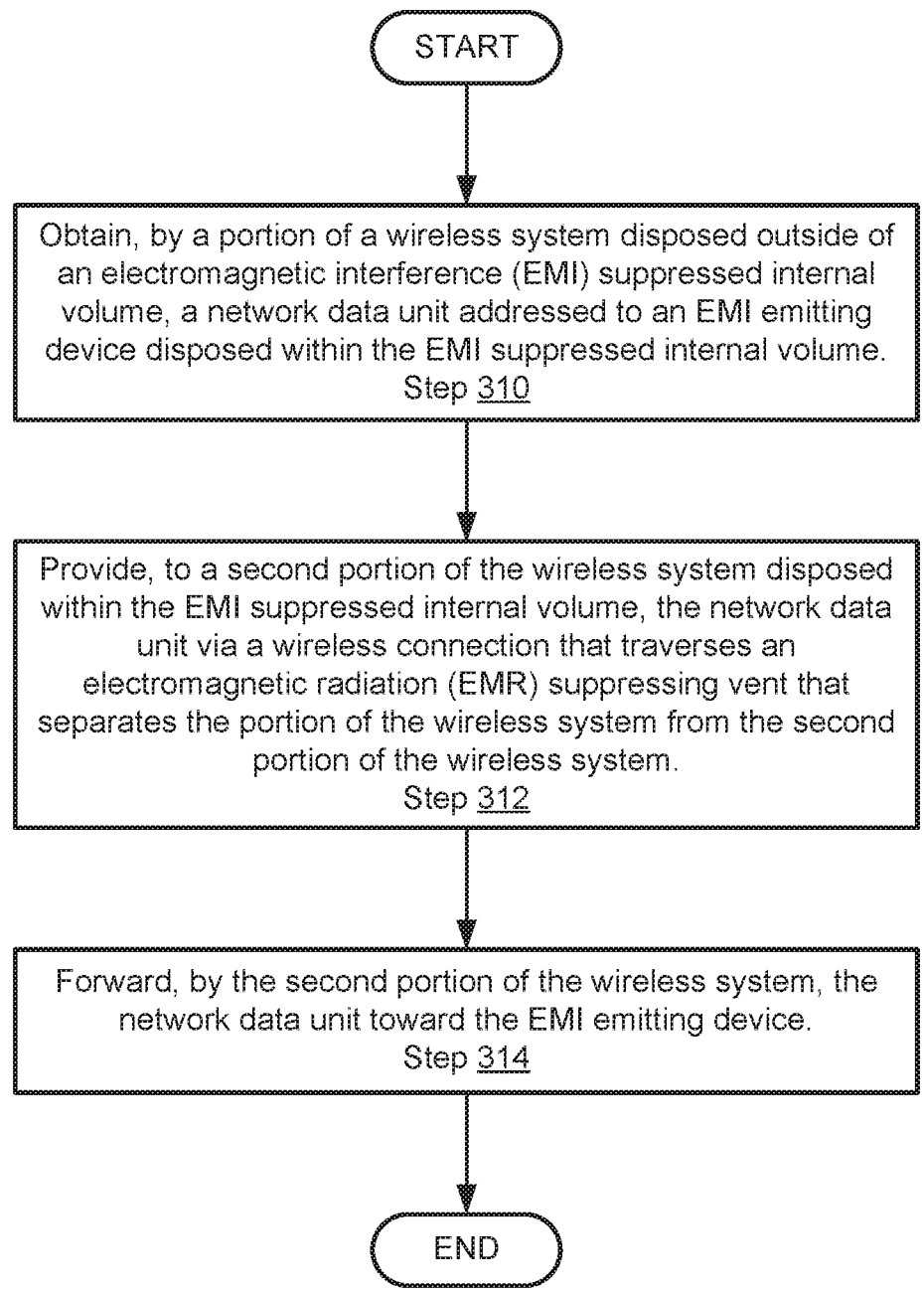
FIG. 3.2

SYSTEM AND METHOD FOR COMMUNICATING EXTERNALLY FROM AN ELECTROMAGNETIC INTERFERENCE SUPPRESSED VOLUME

BACKGROUND

High density environment may include devices that are tightly packed together. In other words, the devices may be physically close to each other. Such an environment presents numerous challenges relating to thermal management, mechanical positioning and orienting of devices, and electrical concerns related to power and operation of such devices.

SUMMARY

In one aspect, a data processing device in accordance with one or more embodiments of the invention includes an internal volume that is electromagnetic interference (EMI) isolated; an electromagnetic radiation (EMR) suppressing vent that defines one wall of the internal volume; and a wireless system that includes: a first portion, disposed in the internal volume, that receives network data units from EMI emitting devices disposed in the internal volume and a second portion of the wireless system; a second portion, disposed outside of the internal volume, that obtains the network data units from the first portion using a wireless connection that utilizes a transmission path that traverses through the EMR suppressing vent.

In one aspect, a method for managing electromagnetic interference (EMI), in accordance with one or more embodiments of the invention includes obtaining, by a first portion of a wireless system disposed in an EMI suppressed internal volume of a data processing device, a network data unit from an EMI emitting device disposed in the internal volume; providing, to a second portion of the wireless system disposed outside of the EMI suppressed internal volume, the network data unit via a wireless connection that utilizes a transmission path that traverses an electromagnetic radiation (EMR) suppressing vent that separates the first portion of the wireless system from the second portion of the wireless system; and forwarding, by the second portion of the wireless system, the network data unit towards a recipient.

In one aspect, a non-transitory computer readable medium in accordance with one or more embodiments of the invention includes instructions that when executed by a data processing device cause the data processing device to perform a method for managing electromagnetic interference (EMI), the method includes obtaining, by a first portion of a wireless system disposed in an EMI suppressed internal volume of a data processing device, a network data unit from an EMI emitting device disposed in the internal volume; providing, to a second portion of the wireless system disposed outside of the EMI suppressed internal volume, the network data unit via a wireless connection that utilizes a transmission path that traverses an electromagnetic radiation (EMR) suppressing vent that separates the first portion of the wireless system from the second portion of the wireless system; and forwarding, by the second portion of the wireless system, the network data unit towards a recipient.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an example system in accordance with one or more embodiments of the invention.

FIG. 1.2 shows a diagram of the example system of FIG. 1.1 in a first configuration in accordance with one or more embodiments of the invention.

FIG. 1.3 shows a diagram of the example system of FIG. 1.1 in a second configuration in accordance with one or more embodiments of the invention.

FIG. 2.1 shows a diagram of a second data processing device in accordance with one or more embodiments of the invention.

FIG. 2.2 shows a first cross section diagram of the data processing device of FIG. 2.1.

FIG. 2.3 shows a second cross section diagram of the data processing device of FIG. 2.1 including a wireless system positioned near a front vent.

FIG. 2.4 shows a third cross section diagram of the data processing device of FIG. 2.1 including a wireless system positioned near a rear vent.

FIG. 2.5 shows the third cross section diagram of the data processing device of FIG. 2.4 in a state where the data processing device has been loaded with some electromagnetic interference emitting devices.

FIG. 3.1 shows a flowchart of a first method of facilitating communications between devices disposed in an electromagnetic interference suppressed internal volume in accordance with one or more embodiments of the invention.

FIG. 3.2 shows a flowchart of a second method of facilitating communications between devices disposed in an electromagnetic interference suppressed internal volume in accordance with one or more embodiments of the invention.

DETAILED DESCRIPTION

Figure 4:
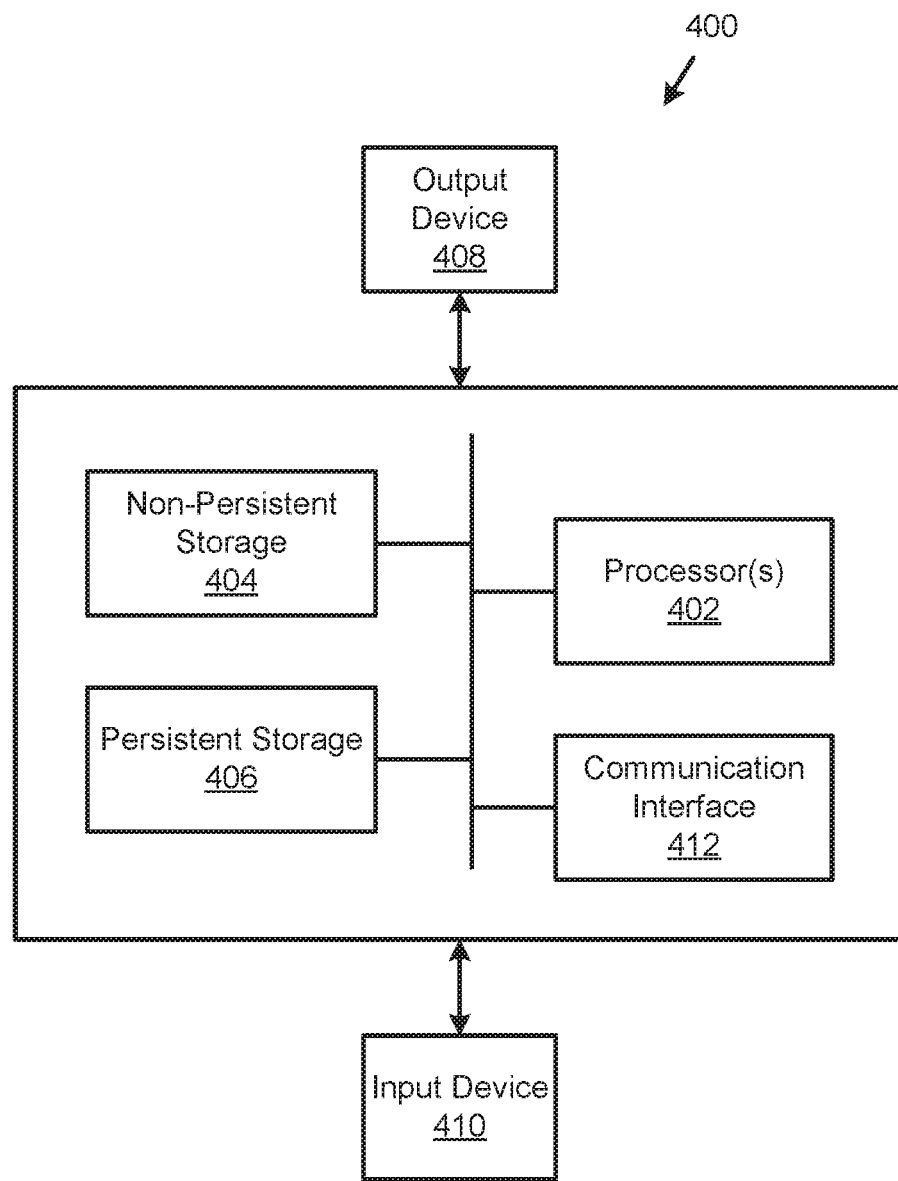
FIG. 4 shows a diagram of a computing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing electromagnetic interference in a high-density environment. Specifically, embodiments of the invention may provide a system that manages electromagnetic interference at a data processing device level. By doing so, embodiments of the invention may facilitate the inclusion of electromagnetic interference emitting devices in a high-density environment while mitigating the impact of electromagnetic interference generated by the electromagnetic interference emitting devices.

In one or more embodiments of the invention, a data processing device includes an internal volume for housing any number of electromagnetic interference emitting devices. The data processing device may isolate the electromagnetic interference emitting devices from the ambient environment proximate to the data processing device by at least 90 decibels (or another desirable level of electromagnetic interference suppression). For example, a data processing device in accordance with embodiments of the invention may provide greater than 35 decibels of isolation, between 35-50 decibels of isolation, between 50-65 decibels of isolation, between 65-80 decibels of isolation, and/or greater than 80 decibels of isolation.

The isolation may be over a first frequency range that corresponds to frequencies on which the electromagnetic interference emitting devices are likely to radiate electromagnetic radiation. For example, the internal volume may have a band stop frequency response tuned to a frequency band on which the electromagnetic interference emitting devices are likely to radiate electromagnetic radiation.

In one or more embodiments of the invention, the data processing device includes a wireless system that facilitates communications between electromagnetic interference emitting devices and/or other types of devices disposed within the internal volume. The wireless system may utilize electromagnetic radiation in a second frequency range that is outside of the first frequency range. Consequently, electromagnetic radiation in the second frequency range may propagate outside of the internal volume without significant attenuation. The wireless system may include a portion disposed outside of the internal volume which receives electromagnetic radiation and forwards network data units encoded in electromagnetic radiation towards remote entities. The wireless system may perform a similar process to facilitate transmission of network data units from remote entities to devices disposed within the internal volume.

FIG. 1.1 shows an example system in accordance with one or more embodiments of the invention. The system may include a frame (100) and any number of data processing devices (102). The components of the example system may provide electromagnetic interference management services for devices disposed within the data processing devices (102). By doing so, devices that emit electromagnetic interference may be utilized in a high-density computing environment without negatively impacting the high-density computing environment.

For example, one or more electromagnetic interference emitting devices may be disposed within one or more of the data processing devices (102). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space.

To do so, the system of FIG. 1.1 may reduce the strength of the electromagnetic interference when propagating from inside of a portion of the data processing devices (102) to an ambient environment (or other portions of the data processing devices (102)) around the data processing devices (102) and/or other locations by at least 90 decibels (or another suitable level).

The electromagnetic interference isolation provided by the data processing devices (102) may have a frequency dependent response. For example, the data processing devices (102) may provide at least 90 decibels (dB), or another suitable level of isolation, across a frequency band in which devices that may be disposed within the data processing devices (102) are adapted to emit electromagnetic interference. In other frequency bands, the data processing devices (102) may provide different level or no electromagnetic interference isolation for devices disposed within the data processing devices (102).

Accordingly, a data processing device in accordance with one or more embodiments of the invention may provide electromagnetic interference suppression services that are frequency dependent. In one or more embodiments of the invention, a data processing device provides electromagnetic interference isolation by reducing the strength of electromagnetic interference across at least one frequency band by a predetermined amount (e.g., 90 decibels).

An electromagnetic interference emitting device may be any type of hardware device that intentionally emits electromagnetic radiation as part of its operation. The emissions of electromagnetic radiation may be, for example, continuous, periodic, or intermittent (e.g., at any point in time based on the operation of the respective electromagnetic interference emitting device). An electromagnetic interference emitting device may be, for example, a personal electronic device such as a cellular device (e.g., smart phone, cell phone, etc.), a personal computer (e.g., any type of computing device with wireless communication capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted by the electromagnetic interference emitting device may be stronger in a first frequency band and weaker in a second frequency band. To provide electromagnetic interference suppression services, a data processing device in accordance with one or more embodiments of the invention may attenuate the electromagnetic interference emitted by an electromagnetic interference emitting device by at least a predetermined amount (e.g., 80 decibels) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

In one or more embodiments of the invention, the frame (100) is a physical structure. The physical structure may be adapted to facilitate storage of the data processing devices (102) in a high-density computing environment. The high-density computing environment may be, for example, a data center or another type of location where multiple data processing devices are located. To facilitate storage of the data processing devices (102), the frame (100) may include any number of structural members (e.g., beams, brackets, bars, etc.) and any number of mechanical mounting points (e.g., holes, threaded portions, etc.) disposed on the structural members to facilitate storage of the data processing devices (102).

Different structural members may have different shapes, sizes, and/or other physical characteristics. The shapes, sizes, and/or other physical characteristics of the structural members may be adapted to enable the structural members to be mechanically connected (e.g., permanently or reversibly connected) to each other to form a predetermined structure. The predetermined structure may be, for example, a cage, box, or other type of structure that facilitates positioning and/or orienting the data processing devices (102).

When all, or a portion, of the structural members are mechanically connected to each other, the mechanical mounting points may be disposed at predetermined locations. The predetermined locations may correspond to similar predetermination locations on the data processing devices (102) where mechanical mounting elements, complementary to the mechanical mounting point, are disposed. By doing so, the frame (100) and the data processing devices (102) may be adapted to position the data processing devices (102) in locations and/or orientations compatible with a high-density computing environment, or another environment in which the data processing devices (102) may be located.

The mechanical mounting points may be any type of physical structure for attaching (permanently or reversibly) the data processing devices (102) to the frame (100). There may be any number of mechanical mounting points to facilitate the attachment of any number of data processing devices.

The frame (100) may be implemented using any number of suitable materials. For example, portions of the frame (100) may be implemented using metals (e.g., steel, aluminum, etc.). In another example, portions of the frame (100) may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the frame (100) may be implemented using rubber (e.g., latex, styrene-butadiene rubbers, etc.) The frame (100) may be implemented using any quantity and combination of suitable materials without departing from the invention.

In one or more embodiments of the invention, the data processing devices (102) are physical structures. For example, the data processing devices (102) may include a chassis and one or more computing devices disposed within the chassis. For additional details regarding computing devices, refer to FIG. 4.

A chassis may be a mechanical device that is adapted to (i) facilitate attachment of the data processing device to the frame, (ii) house the one or more computing devices, (iii) house one or more electromagnetic interference emitting devices, and/or (iv) provide thermal management services to the computing devices and/or the electromagnetic interference emitting devices. For example, a chassis may be a frame mountable structure (e.g., a rectangular box) that includes internal space that may be used to house computing devices and/or electromagnetic interference emitting devices. Thus, the chassis may be a frame mountable chassis.

The chassis may be implemented using any number of suitable materials. For example, portions of the chassis may be implemented using metals (e.g., steel, aluminum, etc.). In another example, portions of the chassis may be implemented using polymers (e.g., Polyamides, polycarbonates, polyester, polyethylene, polypropylene, polystyrene, polyurethanes, polyvinyl chloride, polyvinylidene chloride, acrylonitriline butadiene styrene, etc.). In a still further example, portions of the chassis may be implemented using rubber (e.g., latex, styrene-butadiene rubbers, etc.) The chassis may be implemented using any quantity and combination of suitable materials without departing from the invention.

To facilitate attachment of the data processing device to the frame, the chassis may include any number of mechanical mounting elements. The mechanical mounting elements may be located at predetermined locations. The predetermined locations may correspond to similar predetermination locations on the frame (100) where mechanical mounting points, complementary to the mechanical mounting elements, are disposed.

For example, a mechanical mounting element may be a rail disposed on a side of a chassis of a data processing device. The location of the rail may correspond to a position on the frame (100) where a rail guide (i.e., a complementary mechanical mounting point) is disposed. The rail and the rail guide may facilitate attachment of a data processing device to the frame (100) which, in turn, positions and orients the data processing device relative to the frame (100).

To house the one or more computing devices, the chassis may include one or more internal volumes. The internal volumes may facilitate disposing of the one or more computing devices (and/or other devices such as electromagnetic interference emitting devices) within a data processing device.

To house the one or more electromagnetic interference emitting devices, the chassis may include one or more internal volumes. The internal volumes may have a shape or other characteristic(s) that facilitates disposing of the one or more electromagnetic interference emitting devices within the data processing device. For example, an internal volume of the chassis may be a rectangular void capable of housing one or more electromagnetic interference emitting devices.

In one or more embodiments of the invention, the one or more internal volumes of the data processing devices are adapted to restrict propagation of electromagnetic interference emitted by the electromagnetic interference emitting devices (and/or other devices such as computing devices). For example, one or more portions of the chassis that bound the one or more internal volumes may be made of metal of a predetermined thickness to prevent and/or limit transmission of electromagnetic interference through the one or more portions of the chassis. By doing so, the electromagnetic interference generated by the electromagnetic interference emitting devices may be prevented (or at least severely attenuated when leaving an internal volume) from propagating from within the data processing devices (102) into the ambient environment surrounding the respective data processing devices (102).

In another example, one or more portions of the chassis that bound the one or more internal regions may be formed in a manner that filters (e.g., reflects/attenuates radiation of a certain frequency while allowing radiation of other frequencies to propagate) electromagnetic radiation when electromagnetic radiation passes through the portions of the chassis. For example, a portion of the chassis that bounds the one or more internal regions may be a waveguide filter such as an array of holes (e.g., sub-wavelength apertures corresponding to a particular frequency) in a metal sheet. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

In a further example, one or more portions of the chassis that bound the one or more internal regions may be made of an electromagnetic radiation attenuating material of a predetermined thickness to prevent and/or limit transmission of electromagnetic interference through the one or more portions of the chassis. The electromagnetic radiation attenuating material may be, for example, a composite of plastic or rubber that includes particulates of iron, carbonyl iron, or other electromagnetically lossy material. By doing so, the electromagnetic interference generated by the electromagnetic interference emitting devices may be severely attenuated (e.g., attenuated by greater than 90 decibels) when propagating from within the data processing devices (102) into the ambient environment surrounding the respective data processing devices (102).

To provide thermal management services to the computing devices and/or the electromagnetic interference emitting devices, the data processing devices (102) may facilitate the flow of gas proximate to the computing devices and/or electromagnetic interference emitting devices. By doing so, the thermal state (i.e., temperature) of the aforementioned devices may be regulated. The gas may be air or another type/combination of gasses obtained from any source.

For example, a data processing device may include one or more vents that enable gas from a first side of a data processing device to flow into the data processing device, through the data processing device, and out of a second side of the data processing device. The gas, flowing through the data processing device, may be at a different temperature than the computing devices and/or electromagnetic interference emitting devices. Consequently, thermal exchange between the flow of gas and the aforementioned devices may occur resulting in the temperature of the aforementioned devices changing. By doing so, heat generated by the aforementioned devices may be expelled from the devices thereby regulating the temperature of the aforementioned devices.

A system in accordance with embodiments of the invention may include any number of data processing devices. Different data processing devices (102) may have different configurations and/or uses within the system.

For example, some data processing devices may be adapted to house many electromagnetic interference emitting devices while other data processing devices may be primarily adapted to house computing devices. Additional data processing devices may be adapted to exclusively house data processing devices and no electromagnetic interference emitting devices. A system in accordance with embodiments of the invention may include any number and combination of data processing devices adapted for any number of different uses without departing from the invention.

By way of example, the system of FIG. 1.1 may include a first data processing device (104). The first data processing device (104) may be of a larger size than a second data processing device (106) and, consequently, may be capable of housing a larger number of electromagnetic interference emitting devices and/or other types of devices. The system of FIG. 1.1 may further include a third data processing device (108). In contrast to the first data processing device (104) and the second data processing device (106), the internal structure of the third data processing device (108) may be adapted to only housing computing devices rather than electromagnetic interference generating devices.

For additional details regarding data processing devices, refer to FIGS. 2.1-2.5.

As discussed above, data processing devices (102) may house electromagnetic interference emitting devices. When so housed, the electromagnetic interference emitting devices may operate thereby generating electromagnetic interference (e.g., electromagnetic radiation). At different points in time, it may be useful to add or remove electromagnetic interference emitting devices to or from the data processing devices (102). To facilitate such additions and/or removals, different portions of the data processing devices (102) may be adapted to reversibly provide access to the internal volumes of the data processing devices.

For example, the different portions of the data processing devices (102) may be adapted to rotate, translate, or otherwise move with respect to the remaining portions of the data processing devices (102). When the different portions of the data processing devices (102) are in a first predetermination position and/or orientation, they may electromagnetically seal one or more internal volumes of the data processing devices (102). That is, they may limit the extent to which electromagnetic radiation within the internal volumes is able to propagate to an ambient environment. However, when the different portions of the data processing devices (102) are rotated, translated, and/or otherwise moved to a second predetermined position and/or orientation to enable access to the internal volumes, the data processing devices (1102) may not be electromagnetically sealed. Consequently, electromagnetic radiation within the internal volumes may be less limited by the data processing devices (102) to propagate into the ambient environment when access to the internal volumes is provided.

The data processing devices (102) may include hinges, slides, knobs, and/or other mechanical devices that facilitate movement of the different portions of the data processing devices (102) to reversibly reconfigure the data processing devices (102) between states where access (i.e., physical accessibility) to the internal volumes of the data processing devices (102) is provided and states where access to the internal volumes of the data processing devices (102) is not provided. FIGS. 1.2-1.3 show diagrams of the data processing devices (102) facilitating the addition, modification, and/or removal of electromagnetic interference emitting devices from the internal volumes of the data processing devices (102).

While the system of FIG. 1.1 has been illustrated as including a limited number of components, a system in accordance with embodiments of the invention may include any number of frames, data processing devices, and/or other components without departing from the invention. For example, any number of frames (and/or other types of physical devices for positioning/orienting devices) may be used in a high density computing environment to facilitate the placement and/or orientation of any number of data processing devices. Further, the frames may be used to position and/or orient other types of devices. The other types of devices may be, for examples, servers, storage nodes, compute nodes, communication devices (e.g., switches, routers, etc. for facilitating communications between any number of devices and/or devices external to a high density computing environment), or any other type of device that may be used in a computing environment (e.g., data center, computing nodes, communications center, etc.). Thus, the frame and data processing devices may be used in conjunction with any number and/or type of other device without departing from the invention.

FIG. 1.2 shows a diagram of the example system of FIG. 1.1 in a configuration (i.e., after a reconfiguration from the configuration illustrated in FIG. 1.1) where a front vent (110) of the first data processing device (104) has been opened. The front vent (110) may be opened by physically rotating and/or translating the front vent (110) to move the front vent (110) to a new physical location. By opening the front vent (110), physical access to internal volumes of the first data processing device (104) may be provided. Consequently, the internal configuration of the internal volumes of the first data processing device (104) may be modified. For example, electromagnetic interference emitting devices may be removed from and/or added to the internal volumes. Similarly, computing devices may be added to and/or removed from the internal volumes.

However, in the state illustrated in FIG. 1.2, the ability of the first data processing device (104) to limit propagation of and/or attenuate electromagnetic interference generated by electromagnetic interference emitting devices disposed within the first data processing device (104) may be compromised. In other words, the first data processing device (104) may be in an electromagnetic interference suppression compromised state that allows electromagnetic interference within internal volumes of the first data processing device (104) to propagate to the ambient environment around the first data processing device (104) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the first data processing device (104) automatically causes all, or a portion, of the electromagnetic interference emitting devices disposed within its internal volumes to suspend generation of electromagnetic interference when in the electromagnetic interference suppression compromised state illustrated in FIG. 1.2. By doing so, the first data processing device (104) may provide electromagnetic interference management services when the first data processing device (104) is in an electromagnetic interference suppression compromised state. All, or a portion, of the data processing devices of a system in accordance with embodiments of the invention may provide similar electromagnetic interference management services.

Similar to FIG. 1.2, FIG. 1.3 shows a diagram of the example system of FIG. 1.1 in a second configuration after a reconfiguration from the configuration illustrated in FIG. 1.1) where a top door (112) of the second data processing device (106) has been opened after translating the second data processing device (106) with respect to the frame. The top door (112) may be all, or a portion, of the chassis that may be reversibly moved to enable access to internal volumes of the first data processing device (104).

Open the top door (112), for example, the second data processing device (106) may be mounted to the frame (100) via rails that enable the second data processing device (106) to translate with respect to the frame (100) via application of physical force. Once translated to a predetermined location, the top door (112) may be opened by application of physical force by a user.

By opening the top door (112), physical access to the internal volumes of the second data processing device (106) may be provided. Consequently, the internal configuration of the internal volumes of the second data processing device (106) may be modified. For example, electromagnetic interference emitting devices may be removed from and/or added to the internal volumes of the second data processing device (106). Similarly, computing devices may be added to and/or removed from the internal volumes of the second data processing device (106).

However, in the state illustrated in FIG. 1.3, the ability of the second data processing device (106) to limit propagation of and/or attenuate electromagnetic interference generated by electromagnetic interference emitting devices disposed within the second data processing device (106) may be compromised. In other words, the second data processing device (106) may be in an electromagnetic interference suppression compromised state that allows electromagnetic interference within internal volumes of the second data processing device (106) to propagate to the ambient environment around the second data processing device (106) without attenuation. In contrast, in the state illustrated in FIG. 1.1, the first data processing device (104) may be in an electromagnetic interference suppressed state (i.e., electromagnetic interference generated by the electromagnetic interference emitting devices may be contained within the internal volumes and/or attenuated by greater than 90 decibels when propagating out of the internal volumes).

In some embodiments of the invention, the second data processing device (106) automatically causes all, or a portion, of the electromagnetic interference emitting devices disposed within its internal volumes to suspend generation of electromagnetic interference when in the electromagnetic interference suppression compromised state illustrated in FIG. 1.3. By doing so, the second data processing device (106) may provide electromagnetic interference management services when the second data processing device (106) is in an electromagnetic interference suppression compromised state. All, or a portion, of the data processing devices of a system in accordance with embodiments of the invention may provide similar electromagnetic interference management services (e.g., automatically terminating and/or resuming the electromagnetic interference generation depending on the electromagnetic interference suppression state of the data processing device).

Thus, as illustrated in FIGS. 1.1-1.3, a system in accordance with embodiments of the invention may provide electromagnetic interference management services to devices disposed with the data processing devices when the data processing devices are in an electromagnetic interference suppression compromised state or an electromagnetic interference suppressed state.

As discussed above, a system in accordance with one or more embodiments of the invention may include one or more data processing devices. FIGS. 2.1-2.5 show diagrams of data processing devices in accordance with embodiments of the invention.

FIG. 2.1 shows a diagram of the second data processing device (106) in accordance with one or more embodiments of the invention. As discussed above, the second data processing device (106) may provide electromagnetic interference management services for electromagnetic interference emitting devices disposed within the second data processing device (106). In addition to electromagnetic interference management services, the second data processing device (106) may provide power management services and communications services. The aforementioned services may be provided to electromagnetic interference emitting devices and/or computing devices and/or other types of devices disposed within the second data processing device (106).

To do so, the second data processing device (106) may include a chassis (198). The chassis (198) may be a structure that is mountable to a frame. By being mountable to a frame, the chassis (198) may be usable in a high density environment. For example, the chassis (198) may be a rail mount chassis. The chassis (198) may be mountable via other methods (e.g., using mechanical features other than rails such as bolts, screws, pins, etc.).

The chassis (198) may include a front vent (200), a rear vent (204), a support module (208), and a payload module (210). Each of these components of the second data processing device (106) is discussed below.

The front vent (200) may be a physical device for (i) enabling gas flow through the second data processing device (106) and (ii) limiting the propagation of electromagnetic interference from an internal volume of the second data processing device (106) and/or attenuating electromagnetic interference that propagates from an internal volume of the second data processing device (106) to an ambient environment around the second data processing device (106) via the front vent (200).

In one or more embodiments of the invention, the front vent (200) reflects and/or attenuates electromagnetic radiation that is propagating from the internal volume (214) to an ambient environment through the front vent (200) by at least 90 decibels (or another suitable level such as, for example, 30 decibels, 45 decibels, 60 decibels, 75 decibels, etc.). By doing so, the front vent (200) may delineate one of the walls of the internal volume (214) to enable the internal volume (214) to be electromagnetically suppressed and/or isolated by 90 decibels (or another suitable level of suppression/isolation) from the ambient environment and/or other portions of the chassis (e.g., the support module (208)).

In one or more embodiments of the invention, the front vent (200) is a rectangular structure formed with holes (202) that enable gasses to flow between the ambient environment surrounding the second data processing device (106) and an internal volume of the second data processing device (106). By doing so, the second data processing device (106) may provide thermal management services to components disposed within the second data processing device (106) by controlling the flow of gasses from the ambient environment through the second data processing device (106).

For example, the second data processing device (106) may be used in a high-density computing environment in which a source of cool gas is supplied to a first side of the second data processing device (106). In such an environment, the second data processing device (106) may cause the cool gas to flow into the second data processing device (106) via the front vent (200) and exhaust gas out a second side of the second data processing device (106) (e.g., out of the support module (208)). Alternatively, the second data processing device (106) may cause a reverse gas flow, with respect to the gas flow discussed above, if the source of cool gas is supplied proximate to the support module (208) rather than proximate to the front vent (200).

The structure of the front vent (200) may also be adapted to limit propagation of electromagnetic radiation through the front vent (200) and/or attenuate electromagnetic radiation that propagates through the front vent (200). For example, the size, position, number, shape, and/or other characteristics of the holes (202) through the front vent may be adapted to (i) limit propagation of electromagnetic radiation and/or (ii) attenuate propagating electromagnetic radiation. In another example, the thickness and material choice of the front vent (200) may be adapted to (i) limit propagation of electromagnetic radiation and/or (ii) attenuate propagating electromagnetic radiation. By being so adapted, the front vent (200) may attenuate electromagnetic radiation that propagates through the front vent (200) by at least 90 decibels or another desirable quantity (e.g., 30 decibels, 45 decibels, 60 decibels, 75 decibels, 120 decibels, etc.).

To facilitate the flow of gas between the ambient environment and the internal volume of the second data processing device (106), the size, position, number, shape, and/or other characteristics of the holes (202) may be selected to meet gas flow requirements for thermal management purposes while providing electromagnetic interference suppression characteristics.

In one or more embodiments of the invention, the rear vent (204) is similar to the front vent (200). For example, the rear vent (204) may provide similar attenuation and/or restriction of propagation of electromagnetic radiation while enabling gasses to flow between internal volumes of the second data processing device. The rear vent (204) may have a similar structure to that of the front vent (200). However, the structure (e.g., different hole pattern, thickness, hole type, etc.) and/or electromagnetic (e.g., attenuation and/or reflection of electromagnetic radiation) and/or hydrodynamic (e.g., impedance to fluid flow) characteristics of the rear vent (204) may be different from the front vent (200) without departing from the invention.

The payload module (210) may be a physical device for (i) housing electromagnetic interference devices, (ii) limiting propagation of electromagnetic interference from internal volumes of the second data processing device (106) to the ambient environment surrounding the second data processing device (106), and (iii) thermally regulating devices disposed within the payload module (210). For additional details regarding the payload module (210), refer to FIG. 2.2.

The support module (208) may be a physical device for housing devices that provide services to devices disposed within the payload module (210). For example, the support module (208) may house one or more power supplies (e.g., a power system), fans (e.g., a thermal management system), networking devices (e.g., a communication system), and/or computing devices. The aforementioned devices may provide corresponding services to devices disposed in other portions of the second data processing device (106) and/or devices located in other locations (i.e., external to the second data processing device (106).

In one or more embodiments of the invention, the support module (208) does not provide electromagnetic interference management services to devices disposed within the support module (208), in contrast to the payload module (210). For example, the support module (208) may not intentionally isolate electromagnetic interference generated by devices disposed within the support module (208) from the ambient environment surrounding the second data processing device (106). Intentionally isolating electromagnetic interference means that the structure of a physical structure is adapted to provide such isolation. While many types of physical structures may provide some degree of electromagnetic interference isolation as an inherent consequence of their existence, the electromagnetic interference isolation is not intended. Rather, the physical structures may exist for their other properties such as mechanical strength while providing some degree (albeit low) of electromagnetic interference isolation. Thus, while the support module (208) may to some degree electromagnetically separate devices disposed within the support module (208) from the ambient environment, the support module (208) does not provide electromagnetic interference management services. Providing electromagnetic interference management services may refer to providing at least 20 decibels of attenuation.

In one or more embodiments of the invention, providing electromagnetic interference management services reduces the strength of electromagnetic radiation by at least 20 decibels when the electromagnetic radiation propagates from an internal volume of a data processing device to an ambient environment outside of the data processing device.

The one or more power supplies may supply power to other devices. For example, the power supplies may provide power to electromagnetic interference emitting devices disposed within the payload module (210), other types of devices (e.g., computing device) disposed within the payload module, and/or devices located in other areas.

The one or more power fans may provide thermal management services to other devices. For example, the fans may regulate the flow of gasses through the second data processing device and, consequently, manage the thermal state of electromagnetic interference emitting devices and/or other types of devices disposed in the payload module (210) and/or the support module (208).

The one or more power networking devices may provide communication services to other devices (e.g., providing network services). For example, the networking devices may manage network interfaces that enables the second data processing device (106) to communicate with other devices (e.g., computing devices that may be controlling the operation of the electromagnetic interference emitting devices).

The one or more computing devices may manage the operations of the other entities of the second data processing device (106). For example, the computing devices may send messages to the electromagnetic interference emitting devices to perform predetermined functionality. Such messages, when received by the electromagnetic interference emitting devices may cause the electromagnetic interference emitting devices to stop and/or start emitting electromagnetic interference (and/or perform other actions).

The computing devices may send such instructions when (or around the time when) the electromagnetic interference suppression state of the second data processing device (106) is changed (i.e., when portions of the second data processing device (106) are physically reconfigured). The computing devices may make such determinations based on any number of sensors (not shown) that monitor the physical configuration of the second data processing device (106). The sensors may be disposed, for example, in the payload module, on the vents, or at other locations such that measurements by the sensors indicate the thermal state of components of the second data processing device for which thermal management services (e.g., monitoring the thermal state of components and taking actions such as modifying the rate of gas flow to manage the thermal state of the components) are being provided.

In another example, the computing devices may send messages to fan controllers (not shown) or other devices that manage the operation of gas flow control devices disposed within the second data processing device (106). The computing devices may send such messages based on the thermal state (i.e., temperature) of one or more devices disposed within the second data processing device (106). The computing devices may monitor such thermal states using any number of sensors (not shown) and/or based on messages received from the one or more devices disposed within the second data processing device (106).

In response to receipt of such messages, the fan controllers or other devices may modify the operational state of the gas flow control devices. By doing so, the computing devices may change the thermal state of devices disposed within the second data processing device (106) by controlling the flow of gasses through the second data processing device (106).

To manage the operation of the other entities of the second data processing device (106), one or more processors of the computing devices may execute instructions (e.g., computer code), stored on a persistent storage, that cause the computing devices to perform all, or a portion, of the method illustrated in FIGS. 3.2-3.3. For additional details regarding computing devices, refer to FIG. 4.

To further clarify aspects of embodiments of the invention, a cross section diagram of the second data processing device (106) in accordance with one or more embodiments of the invention is shown in FIG. 2.2. In FIG. 2.2, the cross section is taken along the X-Y plane illustrated in FIG. 2.1.

As seen from FIG. 2.2, the payload module (210) may include an internal volume (214). The internal volume (214) may be used to house devices such as electromagnetic interference emitting devices, supports for such devices, and/or other devices that may provide services to the electromagnetic interference emitting devices and/or other devices.

The internal volume (214) may be bounded, on four sides, by portions of the payload module (210). For example, the internal volume (214) may be bounded by a top door (212), a bottom (218), a first side (216), and a second side (not shown). These four components of the payload module (210) may define a rectangular shape of the internal volume (214).

The internal volume (214) may be further bounded, on a fifth and sixth size, by the front vent (200) and the rear vent (204). The front vent (200) and the rear vent (204) may be on opposite sides of the internal volume (214). By doing so, the front vent (200) and the rear vent (204) may define an gas flow path through the payload module (210). For example, gasses may be able to flow from between the two vents through the internal volume (214). For additional discussion of gas flow paths, refer to FIG. 2.5.

As discussed above, the second data processing device may control gas flows disposed within the second data processing device to provide thermal management services. To do so, the second data processing device may include a thermal management system (220). The thermal management system (220) may include (i) flow control devices, (ii) temperature sensors, and/or (iii) a controller.

The controller may operate the flow control devices based on temperature information obtained from the temperature sensors and/or temperature information obtained from other devices (e.g., from electromagnetic interference emitting devices). For example, the controller may increase the flow rate of an gas flow disposed within the second data processing devices to manage the temperature of one or more devices within a predetermined range.

The flow control devices may be, for example, fans or other types of active devices for controlling the flow of gasses. The thermal management system (220) may include any number of flow control devices without departing from the invention.

The second data processing device may also include a power system (222). The power system may provide power to any number and/or types of devices disposed within the second data processing device. For example, the power system (222) may provide power to electromagnetic interference emitting devices disposed within the payload module (210), the thermal management system (220), a communication system (224), and/or computing devices (226).

To do so, the power system (222) may include, for example, one or more power supplies, regulators, controllers, and/or other types of components for providing power. The aforementioned components may identify components to which power is to be supplied, identify a quantity of power to supply to each of the components, and/or provide the power to each of the respective components. As will be discussed in greater detail below, the power system (222) may provide power using an interconnect (230).

The second data processing device may further include a communication system (224). The communication system may provide communication services. As discussed above, due to the electromagnetic interference isolation provided by the second data processing device, components disposed within the payload module (210) may be unable to utilize the services provided by the communication system (224). Consequently, a second communication system, at least partially disposed within the payload module (210) may be present in one or more embodiments of the invention. For additional details regarding such a communication system, refer to FIGS. 2.3-2.5.

To do so, the communication system (224) may include, for example, one or more transceivers, communication processors, and/or other types of components for providing communication services. The aforementioned components may provide the communication services. The communication services may include, for example, exchanging network data units with electromagnetic interference emitting devices disposed in the payload module, a computing device (226) disposed in the support module (208), and/or other devices disposed outside of the second data processing device. By doing so, the aforementioned devices may communicate with one another via information included in the exchanged network data units. A network data unit may be a communication supported by a communication protocol that enables information to be transmitted. A network data unit may be, for example, a packet in the vent that an internet protocol is utilized. As will be discussed in greater detail below, the communication system (224) may provide the communication services using an interconnect (230).

The computing device (226) may manage the operation of the components of the second data processing device. For example, the computing device (226) may manage the thermal management system (220), the power system (222), the communication system (224), and/or other components (such as electromagnetic interference emitting devices) disposed within the second data processing device. To manage the other devices, the computing device (226) may use the communication services provided by the communication system (224) as well as the interconnect (230).

The interconnect (230) may be a physical device for providing operable connections between devices disposed within the second data processing device. The interconnect (230) may support distribution of power by the power system (222) to any number of devices disposed within the payload module (210), the support module (208), and/or other locations.

For example, the interconnect (230) may include a set of wires that physically interconnect devices disposed within the second data processing device.

In one or more embodiments of the invention, the interconnect (230) facilitates distribution of power to electromagnetic interference emitting devices disposed within the payload module (210) while the electromagnetic interference emitting devices are isolated. By doing so, the electromagnetic interference emitting devices may be provided power without negatively impacting the operation of other devices due to electromagnetic interference generated by the electromagnetic interference emitting devices.

To do so, the second data processing device may include a back-plane (232). The back-plane may electromagnetically isolate the interconnect (230) from the internal volume of the payload module (210). For example, the back-plane (232) may be a metal sheet of sufficient thickness to prevent electromagnetic interference from penetrating through the back-plane (232).

The back-plane (232) may include any number of feedthroughs (234). The feedthroughs (234) may be physical devices that enable the interconnect (230) to physically connect to any number of devices disposed within the payload module (210).

To further clarify the operation of the second data processing device, FIG. 2.3 shows a second cross section diagram, similar to that of FIG. 2.2, but including a wireless system (240) that facilitates communications from within an internal volume and an ambient environment. The wireless system (240) may be a wireless communications system that enables one or more devices disposed within the payload module (210) to communicate with devices disposed outside of the payload module (210). As discussed above, the payload module (210) may include an internal volume that is electromagnetically isolated from the ambient environment and/or other portions of the data processing device. Consequently, electromagnetic interference emitting devices and/or other types of devices disposed within the internal volume may be unable to communicate with devices outside of the internal volume absent the wireless system (240).

The wireless system (240) may include two portions. The first portion (244) may be disposed outside of the internal volume of the payload module (210) and the second portion (246) may be disposed inside of the internal volume. The first portion (244) and the second portion (246) may be physically separated by the front vent (200).

Each of the portions (244, 246) may be physical devices that facilitate wireless communications between the respective portions and other entities. For example, each of the portions (244, 246) may include wireless transceivers, antennas, network data unit processors, and/or other types of components to facilitate wireless communications.

The wireless transceivers may be physical devices that generate signals onto which data is encoded. For example, the wireless transceivers may include modulators, power amplifiers, and digital signal processors to generate an electrical signal upon which data has been encoded. The wireless transceivers may be any type of wireless transceiver without departing from the invention.

The antennas may be physical devices adapted to radiate and pick up signals generated by the wireless transceivers. For example, the antennas may be patch antennas, planar inverted F antennas, monopole/dipole antennas, or any other type of antenna. The antennas of each of the portions of the wireless system (240) may be oriented along the path indicated by the wireless connection (242) illustrated as a dashed line terminating in double arrows. For example, the angle of maximum directivity of the respective antennas may be directed along the path indicated by the wireless connection (242). By doing so, transmission path for electromagnetic radiation that traverses through the front vent (200) may be formed. Thus, when signals are generated by either of the wireless transceivers, the signals may be radiated by the antennas primarily along a transmission path that traverses through the front vent (200).

In one or more embodiments of the invention, the wireless transceivers and the antennas are adapted to operate in a frequency band that is outside of the frequency band in which electromagnetic interference emitting devices generate electromagnetic radiation. For example, consider a scenario in which the electromagnetic interference emitting devices for personal electronic devices that emit electromagnetic radiation at 2.4 GHz. In such a scenario, the wireless transceivers in the antennas may be adapted to operate in a frequency band that is higher than the 2.4 GHz band. For example, the wireless transceivers and the antenna may be adapted to operate in the 60 GHz frequency band (i.e., the V-band). The wireless transceivers and the antenna may be adapted to operate in other frequency bands without departing from the invention. For example, wireless transceivers and the antenna may operate at optical frequencies.

In one or more embodiments of the invention, wireless transceivers and the antennas are adapted to operate in a frequency band that is outside of the frequency band in which the front vent (200) provides electromagnetic interference suppression services. As discussed above, front vent (200) may prevent and/or attenuate propagation of electromagnetic radiation from the internal volume to the ambient environment. However, front vent (200) may only prevent and/or attenuate propagation of electromagnetic radiation over a predetermined frequency band.

For example, the front vent (200) may have a band reject frequency response with respect to electromagnetic radiation. The front vent (200) may reflect and/or attenuate electromagnetic radiation that attempts to propagate through the front vent (200) within a predetermined frequency range. The predetermined frequency range may correspond to the frequency range in which electromagnetic interference emitting devices radiate electromagnetic radiation when operating.

In another example, the front vent (200) may have a high pass frequency response with respect to electromagnetic radiation. The front vent (200) may reflect and/or attenuate electromagnetic radiation that attempts to propagate through the front vent (200) up to a predetermined frequency. The predetermined frequency range may correspond to the frequency range in which electromagnetic interference emitting devices radiate electromagnetic radiation when operating.

While the frequency response of the front vent (200) has been described with respect to idealized characteristics (e.g., band reject, band pass), the frequency response of the front vent (200) may include roll-off, compression, and/or other types of non-ideal behaviors. Consequently, the frequency range of operation of the components of the wireless system (240) may be adapted to take into account non-ideal behaviors of the front vent (200). To do so, the operating frequency range of the wireless system (240) may include a buffer region or simply operate in a substantially different frequency range than the front vent (200) and/or electromagnetic interference emitting devices.

In one or more embodiments of the invention, the network data unit processors of the wireless system (240) are adapted to receive network data units, make a determination with respect to where to send network data units, and forward the network data units accordingly. For example, consider a scenario in which an electromagnetic interference emitting device disposed within the payload module (210) sends a network data unit to the second portion (246) for forwarding to a remote entity (not shown). In response to receiving the network data unit, the second portion (246) may transmit the network data unit to the first portion (244) using the wireless connection (242). Once received, a packet processor of the first portion (244) may analyze the network data unit and make a determination with respect to where to send the network data unit.

While not illustrated in FIG. 2.3, the first portion (244) may be operably connected to any number of other entities via any combination of wired and/or wireless networks. Thus, the first portion (244) of the wireless system (240) may facilitate forwarding of network data units to any number of remote entities (not shown).

While not illustrated in FIG. 2.3, the second portion (246) may be operably connected to any number of devices disposed within the internal volume of the payload module (210). The operable connections may be implemented using any combination of wired and/or wireless networks. For example, an electromagnetic interference emitting device disposed within the payload module may operably connect to the second portion (246) via a first wireless connection (not shown). The first wireless connection may operate in a frequency range corresponding to the operational frequency range of the front vent (200). Consequently, the front vent (200) may prevent electromagnetic radiation used by the first wireless connection for communication purposes from propagating outside of the payload module (210) without being significantly attenuated (e.g., 90 dB). Any of the aforementioned connections may use any communication protocol without departing from the invention. Further, different connections may utilize different communication protocols without departing from the invention.

Thus, electromagnetic radiation used to support the wireless connections between devices disposed within the payload module (210) and a second portion (246) may be electromagnetically isolated from the ambient environment and/or other portions of the data processing device (e.g., the support module (208)).

While the wireless system (240) has been illustrated as being disposed in an ambient environment and the internal volume, the portions of the wireless system (240) may be disposed at other locations without departing from the invention. FIG. 2.4 shows a third cross section diagram, similar to that of FIG. 2.2, but including a wireless system (240) that facilitates communications from within an internal volume and an ambient environment. In contrast to the location of the wireless system (240) in FIG. 2.3, the wireless system (240) is located in the support module (208) and the payload module (210) in FIG. 2.4.

When positioned as illustrated in FIG. 2.4, the first portion (244), and the second portion (246) may support a wireless connection (242) that includes a transmission path through the rear vent (204), rather than the front vent (200) as illustrated in FIG. 2.3. By doing so, positioning of the wireless system (240) as illustrated in FIG. 2.4 may facilitate transmission of network data units into the support module (208). In such a scenario, the first portion (244) may forward network data units to the communication system (224) of the support module (208) rather than forwarding network data units to remote entities. The communication system (224) may appropriately forward received network data units.

Thus, the data processing devices of FIGS. 2.1-2.4 may facilitate the electromagnetic isolation of electromagnetic interference emitting devices may still enabling the electromagnetic interference emitting devices to communicate with remote entities using a wireless transmission path that traverses vent that suppresses the electromagnetic radiation generated by the electromagnetic interference emitting devices.

To further clarify interactions between electromagnetic interference emitting devices and a wireless system (240), a cross section diagram in accordance with one or more embodiments of the invention that is similar to the cross-section diagram of FIG. 2.4 is shown in FIG. 2.5. As seen from FIG. 2.5, the cross-section diagram includes the number of electromagnetic interference emitting devices (250). As seen in FIG. 2.5, electromagnetic interference emitting devices (250) may be provided with power through the interconnect (230) and the feedthroughs (234).

To operably connect the electromagnetic interference emitting devices (250), the aforementioned devices may be operably connected to the second portion (246) of the wireless system (240). The second portion (246) may be operably connected to the first portion (244) through the wireless connection (242). The wireless connection (242) may utilize a transmission path that traverses through the rear vent (204).

The operable connections between electromagnetic interference emitting devices (250) and the second portion (246) may operate within a first frequency band that corresponds to the frequency band in which the internal volume of the payload module (210) electromagnetically isolates electromagnetic interference emitting devices (250). In contrast, the wireless connection (242) may utilize a second frequency band that is outside of the frequency band in which the internal volume of the payload module (210) electromagnetically isolates electromagnetic interference emitting devices (250).

The first portion (244) may provide network data unit forwarding services for network data units received from the second portion (246), a communication system disposed within the support module (208), and/or remote entities. By doing so, the wireless system (240) may operably connect electromagnetic interference emitting devices (250) to any number of entities disposed outside of the internal volume of the payload module (210).

To provide the above-noted functionality of the wireless system (240), the wireless system (240) may perform all or a portion of the methods illustrated in FIGS. 3.1-3.2. The methods illustrated in the aforementioned figures may be used to operably connect electromagnetic interference emitting devices with remote entities.

FIG. 3.1 shows a flowchart of a method in accordance with one or more embodiments of the invention. The method depicted in FIG. 3.1 may be used to send network data units from within internal volumes to remote recipients in accordance with one or more embodiments of the invention. The method shown in FIG. 3.1 may be performed completely, or in part, by, for example, data processing devices (e.g., 102, FIG. 1.1). Other components of the system illustrated in FIG. 1.1 may perform all, or a portion, of the method of FIG. 3.1 without departing from the invention.

While FIG. 3.1 is illustrated as a series of steps, any of the steps may be omitted, performed in a different order, additional steps may be included, and/or any or all of the steps may be performed in a parallel and/or partially overlapping manner without departing from the invention.

In step 300, a network data unit is obtained from an electromagnetic interference emitting device by a first portion of a wireless system disposed in electromagnetic interference emitting suppressed internal volume.

In one or more embodiments of the invention, the network data unit is a packet. The network data unit may be other types of elemental data units of different communication schemes without departing from the invention.

In one or more embodiments of the invention, the network data unit is obtained via an operable connection between electromagnetic interference emitting device and the first portion of the wireless system. For example, electromagnetic interference emitting device may be operably connected to the first portion of the wireless system via a first wireless connection. The first wireless connection may operate in a frequency range corresponding to a frequency range which is electromagnetically suppressed in the internal volume.

In step 302, the network data unit is provided to a second portion of the wireless system disposed outside of the electromagnetic interference suppressed volume via a wireless connection that traverses an electromagnetic radiation suppressing vent that separates the first portion of the wireless system and the second portion of the wireless system.

In one or more embodiments of the invention, electromagnetic radiation suppressing vent is a front vent or a rear vent as discussed with respect to FIGS. 2.1-2.5.

In one or more embodiments of the invention, the wireless connection operates in a frequency band outside of the frequency band which is suppressed by the electromagnetic radiation suppressing vent. For example, electromagnetic interference suppressing vent may reflect and/or attenuate electromagnetic radiation in the frequency band of 0.5 GHz-10 GHz. In such a scenario, the wireless connection may operate in the 60 GHz frequency band. The wireless connection may operate in other frequency bands outside of the frequency band in which electromagnetic interference suppressing vent reflects and/or attenuate electromagnetic radiation without departing from the invention.

In one or more embodiments of the invention, the wireless connection is an optical connection. That is, the wireless connection may use electromagnetic radiation in an optical (or near optical band) band to transmit information through the front vent or the rear vent (or another similar structure).

In step 304, the network data unit is forwarded by the second portion of the wireless system toward a recipient.

The network data unit may be forwarded via any communications protocol without departing from the invention. For example, if the network operably connected to the second portion of the wireless system supports Internet protocol communications, the second portion of the wireless system may forward the network data unit using Internet protocol-based method. In another example, if the network operably connected to the second portion of the wireless system supports Ethernet communications, the second portion of the wireless system may forward the network data unit using an Ethernet protocol-based method.

The method may end following step 304.

FIG. 3.2 shows a flowchart of a method in accordance with one or more embodiments of the invention. The method depicted in FIG. 3.2 may be used to send network data units from within internal volumes to remote recipients in accordance with one or more embodiments of the invention. The method shown in FIG. 3.2 may be performed completely, or in part, by, for example, data processing devices (e.g., 102, FIG. 1.1). Other components of the system illustrated in FIG. 1.1 may perform all, or a portion, of the method of FIG. 3.2 without departing from the invention.

While FIG. 3.2 is illustrated as a series of steps, any of the steps may be omitted, performed in a different order, additional steps may be included, and/or any or all of the steps may be performed in a parallel and/or partially overlapping manner without departing from the invention.

In step 310, a network data unit addressed to an electromagnetic interference emitting device disposed within an electromagnetic interference suppressed internal volume is obtained by a portion of a wireless system disposed outside of the electromagnetic interference suppressed internal volume. For example, the portion of the wireless system may be a first portion (e.g., 244) as illustrated in FIGS. 2.3-2.4.

In one or more embodiments of the invention, the network data unit is obtained from a remote entity. For example, the remote entity may be a computing device. In another example, the remote entity may be an electromagnetic interference emitting device disposed in a second internal volume that is electromagnetic interference suppressed.

In one or more embodiments of the invention, the portion of the wireless system is separated from the electromagnetic interference emitting device by event. The vent may be, for example, a front vent or a rear vent as discussed with respect to FIG. 2.3.

In step 312, the network data unit is provided to a second portion of the wireless system that is disposed within electromagnetic interference suppressed internal volume via a wireless connection that traverses an electromagnetic radiation suppressing vent that separates the portion of the wireless system from the second portion of the wireless system. For example, a second portion of the wireless system may be similar to the second portion (e.g., 246) as illustrated in FIGS. 2.3-2.4.

In one or more embodiments of the invention, the electromagnetic radiation suppressing vent is similar to the front vent for the rear vent as discussed with respect to FIG. 2.3. Electromagnetic radiation suppressing vent may electromagnetically isolate the internal volume from the ambient environment and, consequently, isolate the second portion of the wireless system from the portion of the wireless system by at least 90 dB or another appropriate amount of isolation in a particular frequency band.

In one or more embodiments of the invention, the wireless connection is implemented using electromagnetic radiation (i.e., the carrier waves) having a frequency content that is outside of a frequency range over which the electromagnetic radiation suppressing vent reflects and/or attenuates electromagnetic radiation. For example, the wireless connection may be implemented using electromagnetic radiation in the 60 GHz frequency band while electromagnetic radiation suppressing vent primarily reflects and/or attenuates electromagnetic radiation below 10 GHz.

In step 314, the network data unit is forwarded by the second portion of the wireless system toward the electromagnetic interference emitting device which the network data unit is addressed.

In one or more embodiments of the invention, the network data unit is forwarded via a second wireless connection between the second portion of the wireless system and the electromagnetic interference emitting device. The second wireless connection may be implemented using electromagnetic radiation having a frequency content corresponding to frequency range over which the electromagnetic radiation suppressing vent reflects and/or attenuates electromagnetic radiation to electromagnetically isolate the internal volume from the ambient environment and/or other portions (e.g., a support module) of the data processing device.

In one or more embodiments of the invention, network data unit is forwarded via a wired connection between the second portion of the wireless system and electromagnetic interference emitting device.

The method may end following step 314.

Thus, via the method illustrated in FIGS. 3.1-3.2, electromagnetic interference emitting devices (and/or other types of devices) disposed within a data processing device may be managed to enable to communicate with remote and/or other types of entities while still being electromagnetically isolated from an ambient environment.

As discussed above, embodiments of the invention may be implemented using computing devices. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (112) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide a method, system, and device for managing electromagnetic interference. A system in accordance with embodiments of the invention may manage electromagnetic interference at a data processing device level. That is, such devices may include functionality to limit the propagation of electromagnetic interference from within data processing devices to an ambient environment surrounding the data processing device. By doing so, such data processing devices may be used in a high-density environment without negatively impacting the functionality of the high-density environment.

A data processing device in accordance with embodiments of the invention may provide communication services to devices disposed within the data processing device. To do so, the data processing device may include a wireless connection that operates in a frequency range outside of a frequency range over which the data processing device suppresses electromagnetic interference. For example, the data processing device may implement a wireless connection that uses a propagation path through an electromagnetic radiation suppressing vent that is tuned to suppress electromagnetic radiation generated by electromagnetic interference emitting devices disposed within the data processing device. By doing so, the data processing device may electromagnetically isolate electromagnetic interference emitting devices over frequency band on which the electromagnetic interference emitting devices are likely to radiate electromagnetic radiation. Consequently, the data processing device may simultaneously suppress relevant electromagnetic radiation while still enabling wireless connections that utilize electromagnetic radiation in other bands that are not relevant for electromagnetic interference suppression.

Thus, embodiments of the invention may address the problem electromagnetic interference within a high-density environment. Specifically, embodiments of the invention may provide a data processing device level solution that facilitates granular control of electromagnetic interference in the aforementioned environments while still allowing the electromagnetic interference generating devices to communicate with remote entities.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A data processing device, comprising:
    an internal volume that is electromagnetic interference (EMI) isolated;
    an electromagnetic radiation (EMR) suppressing vent that defines one wall of the internal volume; and
    a wireless system comprising:
        a first portion, disposed in the internal volume, adapted to receive network data units from EMI emitting devices disposed in the internal volume and a second portion of the wireless system; and
        the second portion, disposed outside of the internal volume, adapted to obtain the network data units from the first portion using a wireless connection that utilizes a transmission path that traverses through the EMR suppressing vent.

2. The data processing device of claim 1, wherein the EMR suppressing vent has a high pass filter EMR suppressing characteristic corresponding to a frequency range in which the EMI emitting devices emit EMR.

3. The data processing device of claim 2, wherein the wireless connection has a second frequency range that is out of the frequency range in which the EMI emitting devices emit EMR.

4. The data processing device of claim 1, wherein the EMR suppressing vent is adapted to suppress EMR in a frequency range in which the EMI emitting devices emit EMR by at least 90 decibels.

5. The data processing device of claim 1, wherein the second portion is further adapted to:
    receive second network data units from remote entities; and
    provide the second network data units to the first portion using the wireless connection.

6. The data processing device of claim 5, wherein the first portion is further adapted to:
    obtain the second network data units from the first portion using the wireless connection; and
    forward the second network data units to at least one of the EMI emitting devices.

7. The data processing device of claim 1, wherein the second portion is disposed outside of a chassis of the data processing device.

8. The data processing device of claim 1, wherein the second portion is disposed in a support module of the data processing device.

9. The data processing device of claim 8, wherein the support module is dispose in a chassis of the data processing device.

10. The data processing device of claim 1, wherein the internal volume is adapted to suppress EMR from propagating from within the internal volume to outside of the internal volume by at least 90 decibels in a frequency range in which the EMI emitting devices emit EMR.

11. A method for managing electromagnetic interference (EMI), comprising:
    obtaining, by a first portion of a wireless system disposed in an EMI-suppressed internal volume of a data processing device, a network data unit from an EMI emitting device disposed in the internal volume;
    providing, to a second portion of the wireless system disposed outside of the EMI-suppressed internal volume, the network data unit via a wireless connection that utilizes a transmission path that traverses an electromagnetic radiation (EMR) suppressing vent that separates the first portion of the wireless system from the second portion of the wireless system; and
    forwarding, by the second portion of the wireless system, the network data unit towards a recipient.

12. The method of claim 11, further comprising:
    obtaining, by the second portion of the wireless system, a second network data unit that is addressed to one of the EMI emitting devices disposed within the EMI-suppressed internal volume;
    providing, to the first portion of the wireless system, the second network data unit via the wireless connection; and
    forwarding, by the first portion, the network data unit towards the one of the EMI emitting devices.

13. The method of claim 11, wherein the EMR suppressing vent has a high pass filter EMR suppressing characteristic corresponding to a frequency range in which the EMI emitting devices emit EMR.

14. The method of claim 13, wherein the wireless connection has a second frequency range that is out of the frequency range in which the EMI emitting devices emit EMR.

15. The method of claim 11, wherein the EMR suppressing vent is adapted to suppress EMR in a frequency range in which the EMI emitting devices emit EMR by at least 90 decibels.

16. A non-transitory computer readable medium comprising instructions that when executed by a data processing device cause the data processing device to perform a method for managing electromagnetic interference (EMI), the method comprising:

obtaining, by a first portion of a wireless system disposed in an EMI-suppressed internal volume of the data processing device, a network data unit from an EMI emitting device disposed in the internal volume;

providing, to a second portion of the wireless system disposed outside of the EMI-suppressed internal volume, the network data unit via a wireless connection that utilizes a transmission path that traverses an electromagnetic radiation (EMR) suppressing vent that separates the first portion of the wireless system from the second portion of the wireless system; and forwarding, by the second portion of the wireless system, the network data unit towards a recipient.

17. The non-transitory computer readable medium of claim 16, wherein the method further comprises:

obtaining, by the second portion of the wireless system, a second network data unit that is addressed to one of the EMI emitting devices disposed within the EMI-suppressed internal volume;

providing, to the first portion of the wireless system, the second network data unit via the wireless connection; and forwarding, by the first portion, the network data unit towards the one of the EMI emitting devices.

18. The non-transitory computer readable medium of claim 16, wherein the EMR suppressing vent has a high pass filter EMR suppressing characteristic corresponding to a frequency range in which the EMI emitting devices emit EMR.

19. The non-transitory computer readable medium of claim 18, wherein the wireless connection has a second frequency range that is out of the frequency range in which the EMI emitting devices emit EMR.

20. The non-transitory computer readable medium of claim 16, wherein the EMR suppressing vent is adapted to suppress EMR in a frequency range in which the EMI emitting devices emit EMR by at least 90 decibels.

* * * * *